United States Patent
Cho et al.

(10) Patent No.: US 11,011,228 B2
(45) Date of Patent: May 18, 2021

(54) MEMORY DEVICE HAVING AN INCREASED SENSING MARGIN

(71) Applicant: SAMSUNG ELECTRONICS CO., LTD., Suwon-si (KR)

(72) Inventors: Yongsung Cho, Hwaseong-si (KR); Taehui Na, Seoul (KR); Junho Shin, Hwaseong-si (KR); Makoto Hirano, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/741,153

(22) Filed: Jan. 13, 2020

(65) Prior Publication Data

US 2021/0012835 A1  Jan. 14, 2021

(30) Foreign Application Priority Data

Jul. 10, 2019 (KR) .......................... 10-2019-0083236

(51) Int. Cl.
*G11C 13/00* (2006.01)

(52) U.S. Cl.
CPC .......... *G11C 13/004* (2013.01); *G11C 13/003* (2013.01); *G11C 13/0004* (2013.01); *G11C 13/0026* (2013.01); *G11C 13/0028* (2013.01); *G11C 2013/0054* (2013.01)

(58) Field of Classification Search
CPC . G11C 13/004; G11C 13/0004; G11C 13/003; G11C 13/0028
See application file for complete search history.

(56) References Cited

U.S. PATENT DOCUMENTS

| | | | |
|---|---|---|---|
| 5,764,572 A | 6/1998 | Hammick | |
| 5,936,905 A | 8/1999 | Proebsting | |
| 6,198,671 B1 | 3/2001 | Aoyama et al. | |
| 6,717,877 B2 | 4/2004 | Suzuki et al. | |
| 7,349,264 B2 | 3/2008 | Mokhlesi et al. | |
| 7,808,831 B2 | 10/2010 | Mokhlesi et al. | |
| 8,416,602 B2 | 4/2013 | Kitagawa et al. | |
| 8,917,534 B2 | 12/2014 | Castro | |
| 2015/0287460 A1* | 10/2015 | Lee ..................... | G11C 13/0033 365/148 |
| 2016/0027510 A1* | 1/2016 | Lee ..................... | G11C 13/0033 365/148 |
| 2019/0378567 A1 | 12/2019 | Gangasani et al. | |
| 2020/0168273 A1* | 5/2020 | Kim .................... | G11C 13/0004 |

* cited by examiner

*Primary Examiner* — Han Yang
(74) *Attorney, Agent, or Firm* — F. Chau & Associates, LLC

(57) ABSTRACT

A memory device includes a memory cell array including memory cells disposed at points at which word lines and bit lines intersect, a first decoder circuit determining a selected bit line and non-selected bit lines among the bit lines, a second decoder circuit determining a selected word line and non-selected word lines among the word lines, a current compensation circuit providing a current path drawing a compensation current from the selected word line to compensate for off currents flowing in the non-selected bit lines, a first sense amplifier comparing a voltage of the selected word line with a reference voltage and outputting an enable signal, and a second sense amplifier outputting a voltage difference between the voltage of the selected word line and the reference voltage during an operating time determined by the enable signal in a readout operation mode of the memory device.

17 Claims, 26 Drawing Sheets

MEMORY DEVICE HAVING AN INCREASED SENSING MARGIN

CROSS-REFERENCE TO RELATED APPLICATION

This application claims priority under 35 U.S.C. 119 to Korean Patent Application No. 10-2019-0083236, filed on Jul. 10, 2019 in the Korean Intellectual Property Office, the disclosure of which is incorporated by reference herein in its entirety.

TECHNICAL FIELD

Exemplary embodiments of the present inventive concept relate to a memory device having an increased sensing margin.

DISCUSSION OF RELATED ART

Memory devices using resistance include phase change random access memory (PRAM), resistive RAM (ReRAM), magnetic RAM (MRAM), and the like. Different from a dynamic RAM (DRAM) which writes data by charging or discharging an electric charge, a memory device using resistance may write or erase data using changes in resistance.

SUMMARY

According to an exemplary embodiment of the present inventive concept, a memory device includes a memory cell array including a plurality of memory cells disposed at points at which a plurality of word lines and a plurality of bit lines intersect one another, respectively, a first decoder circuit configured to determine a selected bit line and non-selected bit lines among the plurality of bit lines, a second decoder circuit configured to determine a selected word line and non-selected word lines among the plurality of word lines, a current compensation circuit configured to provide a current path drawing a compensation current from the selected word line to compensate for off currents flowing in the non-selected bit lines, a first sense amplifier configured to compare a voltage of the selected word line with a reference voltage and output an enable signal, and a second sense amplifier configured to output a voltage difference between the voltage of the selected word line and the reference voltage during an operating time determined by the enable signal in a readout operation mode of the memory device.

According to an exemplary embodiment of the present inventive concept, a memory device includes a plurality of memory cells each including a switching device and a data storage device connected to the switching device and including a phase change material, and connected to a plurality of word lines and a plurality of bit lines, a decoder circuit configured to determine a selected word line among the plurality of word lines and a selected bit line among the plurality of bit lines, where the selected word line and the selected bit line are connected to a selected memory cell of the plurality of memory cells from which data is read out, a current compensation circuit configured to compensate for a leakage current flowing through non-selected memory cells other than the selected memory cell in the selected word line, and a first sense amplifier connected to the selected word line, and including a first input terminal configured to receive a sensing voltage corresponding to a state of the selected memory cell and a second input terminal configured to receive a predetermined reference voltage. The first sense amplifier compares a voltage of the selected word line with the predetermined reference voltage in a sensing section of the selected bit line and outputs a result of the comparison between the voltage of the selected word line and the predetermined reference voltage.

According to an exemplary embodiment of the present inventive concept, a memory device includes a plurality of memory cells connected to a plurality of bit lines and a plurality of word lines, a decoder circuit configured to pre-charge a selected word line of the plurality of word lines, and connect the selected word line to a current path in a sensing section, a current compensation circuit configured to provide a current path drawing a compensation current from the selected word line to compensate for off-currents flowing in non-selected bit lines other than a selected bit line among the plurality of bit lines in the sensing section, a first sense amplifier configured to compare a voltage of the selected word line and a reference voltage and output an enable signal in the sensing section, and a second sense amplifier configured to output a voltage difference between the voltage of the selected word line and the reference voltage in response to the enable signal.

BRIEF DESCRIPTION OF DRAWINGS

The above and other aspects and features of the present inventive concept will be more clearly understood by describing in detail exemplary embodiments thereof with reference to the accompanying drawings.

DETAILED DESCRIPTION OF THE EMBODIMENTS

Figure 1:
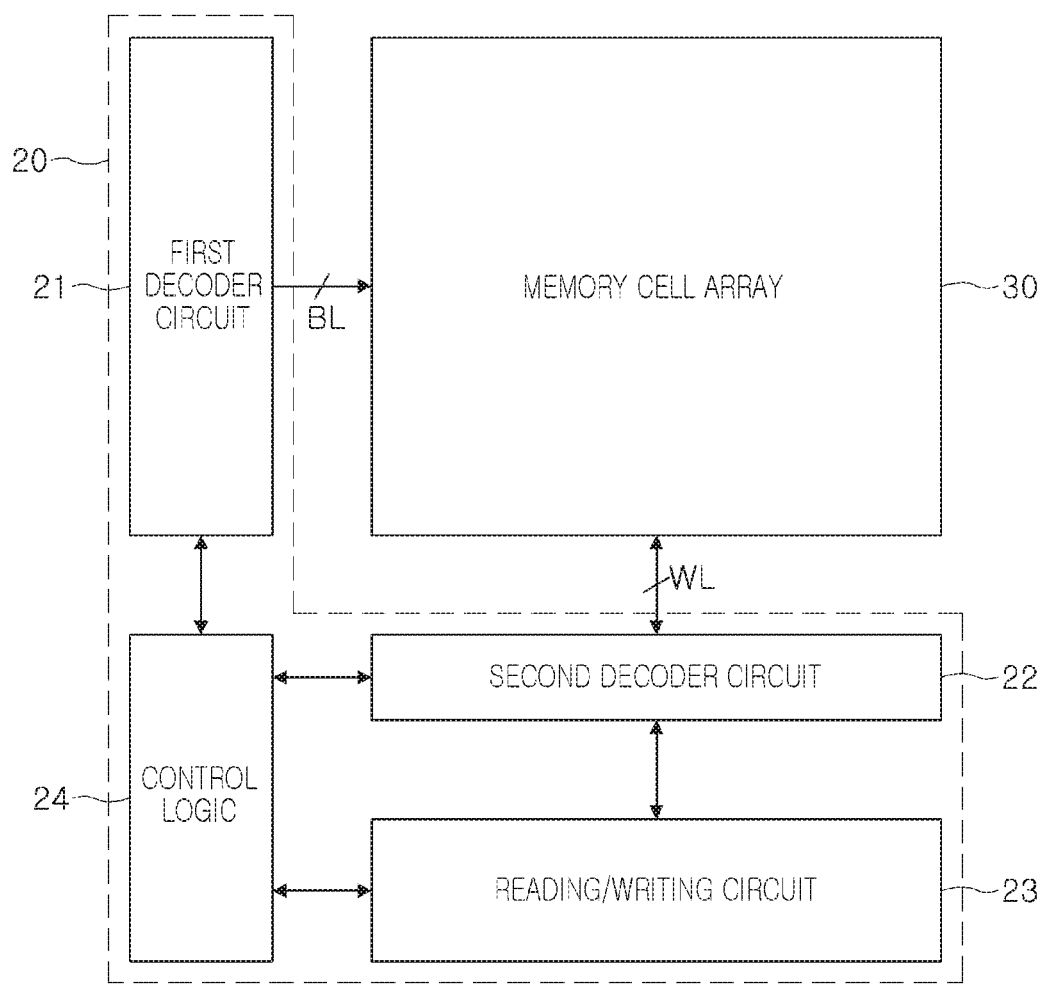
FIG. 1 is a block diagram illustrating a memory device according to an exemplary embodiment of the present inventive concept.

Exemplary embodiments of the present inventive concept provide a memory device which may increase a sensing margin by adjusting an operating time of a sense amplifier therein.

Hereinafter, exemplary embodiments of the present inventive concept will be described in more detail with reference to the accompanying drawings. Like reference numerals may refer to like elements throughout this application.

FIG. 1 is a block diagram illustrating a memory device according to an exemplary embodiment of the present inventive concept. Referring to FIG. 1, a memory device 10 may include a memory controller 20 and a memory cell array 30. The memory controller 20 may include decoder circuits 21 and 22, a reading/writing circuit 23, a control logic 24, and other circuits.

The memory cell array 30 may include a plurality of memory cells. The decoder circuits 21 and 22 may include a first decoder circuit 21 connected to the plurality of memory cells through a bit line BL and a second decoder circuit 22 connected to the plurality of memory cells through a word line WL. Operations of the first decoder circuit 21, the second decoder circuit 22, and the reading/writing circuit 23 may be controlled by the control logic 24.

In an exemplary embodiment of the present inventive concept, the reading/writing circuit 23 may write data in at least one selected memory cell specified by the first decoder circuit 21 and the second decoder circuit 22, or may read out data from a selected memory cell.

Figure 2:
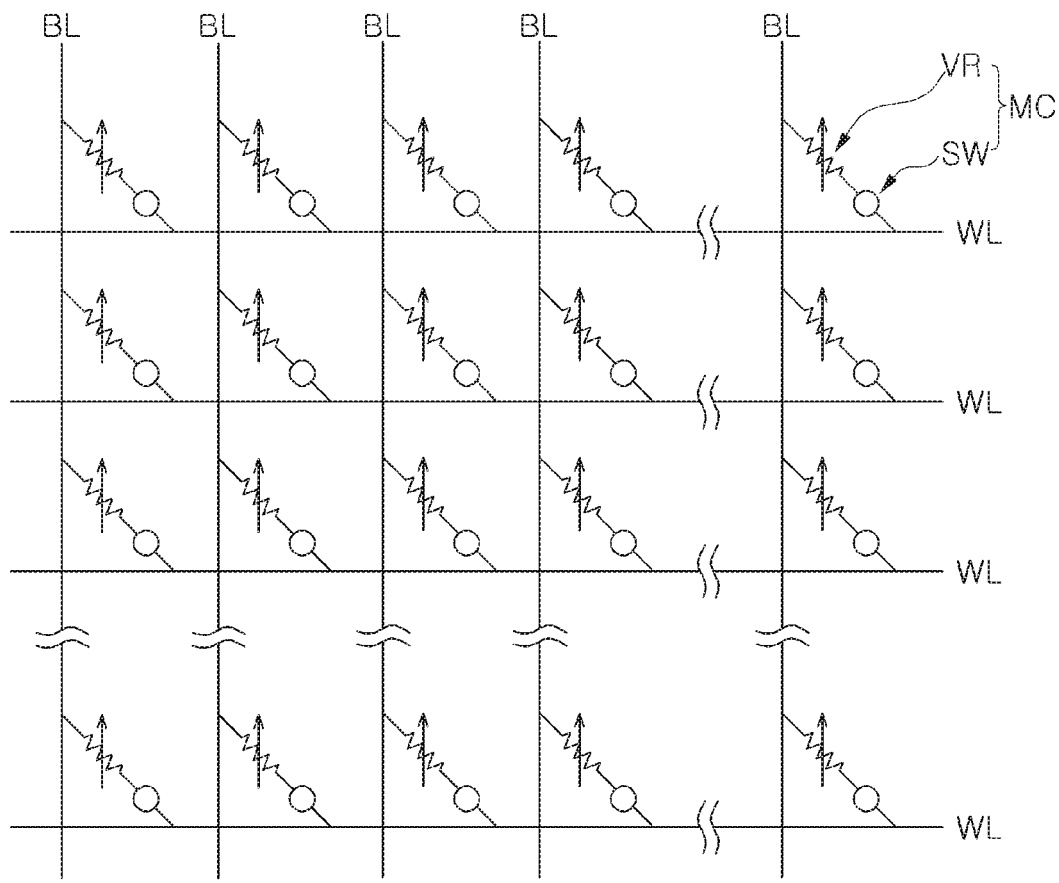
FIG. 2 is a diagram illustrating a memory cell array included in the memory device of FIG. 1 according to an exemplary embodiment of the present inventive concept.

FIG. 2 is a diagram illustrating a memory cell array included in the memory device of FIG. 1 according to an exemplary embodiment of the present inventive concept. Referring to FIG. 2 along with FIG. 1, a memory cell array 30 in the present exemplary embodiment may include a plurality of memory cells MC. Each of the plurality of memory cells MC may be disposed at a point at which the bit line BL and the word line WL intersect each other. Accordingly, each of the plurality of memory cells MC may be connected to a single bit line BL and a single word line WL.

As an example, each of the plurality of memory cells MC may include a switching device SW and a data storage device VR. In an exemplary embodiment of the present inventive concept, the switching device SW may include at least one of a PN junction diode, a short key diode, and an ovonic threshold switch (OTS). In an exemplary embodiment of the present inventive concept, the data storage device VR may be formed of a phase change material including a chalcogenide material, a super-lattice, or the like. The data storage device VR may include a phase change material, a phase of which may change from an amorphous phase to a crystalline phase depending on a heating time, a heating temperature, or the like. The data storage device VR and the switching device SW may be connected to each other in series.

The memory controller 20 may write or erase data by changing a phase of a phase change material of the data storage device VR included in each of the plurality of memory cells MC to an amorphous phase or a crystalline phase through the bit line BL and the word line WL. In an exemplary embodiment of the present inventive concept, the memory controller 20 may increase a resistance of the data storage device VR and may write data by changing the phase of the phase change material of the data storage device VR included in the memory cell MC to an amorphous phase. Alternatively, the memory controller 20 may reduce resistance of the data storage device VR, and may erase data by changing the phase of the phase change material of the data storage device VR included in the memory cell MC to a crystalline phase. A relationship between a resistance value of the data storage device VR and whether data is written may be defined differently. The memory controller 20 may perform a readout operation of reading out data from the plurality of memory cells MC by comparing a readout voltage detected from the plurality of memory cells MC with a reference voltage.

Figure 3:
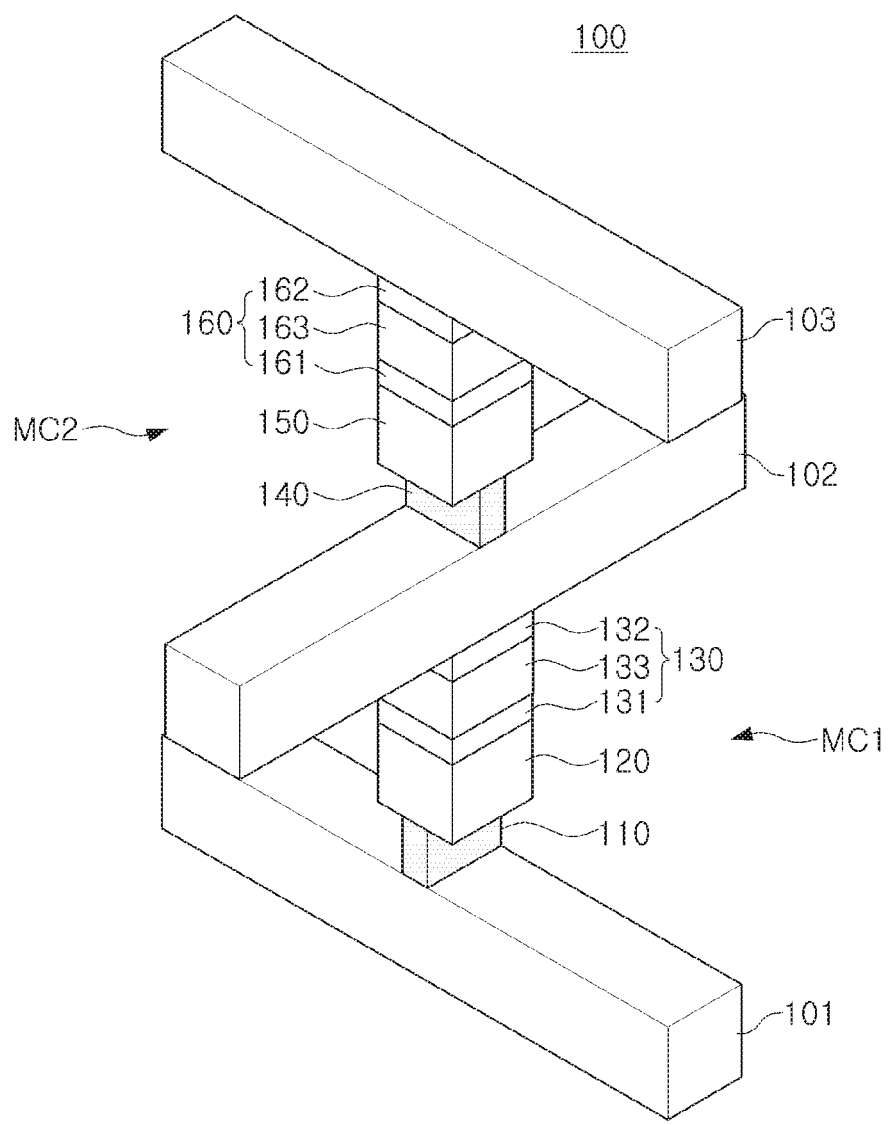
FIG. 3 is a diagram illustrating a structure of a memory cell included in a memory device according to an exemplary embodiment of the present inventive concept.

FIG. 3 is a diagram illustrating a structure of a memory cell included in a memory device according to an exemplary embodiment of the present inventive concept. Referring to FIG. 3, a memory device 100 may include a first memory cell MC1 and a second memory cell MC2 disposed between a plurality of conductive lines 101 to 103. The first memory cell MC1 and the second memory cell MC2 may operate independently.

As an example, when the first conductive line 101 and the third conductive line 103 are word lines, the second conductive line 102 may be a bit line. Additionally, when the first conductive line 101 and the third conductive line 103 are bit lines, the second conductive line 102 may be a word line. In the present exemplary embodiment, a case in which the first conductive line 101 and the third conductive line 103 are configured as a first word line and a second word line, respectively, and the second conductive line 102 is configured as a bit line, will be described.

The first memory cell MC1 may include a first heating electrode 110, a first data storage device 120, a first switching device 130, and other elements. The first switching device 130 may include a first switch electrode 131, a second switch electrode 132, a first selected layer 133 disposed between the first switch electrode 131 and the second switch electrode 132, and other elements. In an exemplary embodiment of the present inventive concept, the first selected layer 133 may include an ovonic threshold switch (OTS) material. When a voltage greater than a threshold voltage is applied between the first switch electrode 131 and the second switch electrode 132, a current may flow through the first selected layer 133.

The first data storage device 120 may include a phase change material. For example, the first data storage device 120 may include a chalcogenide material. As an example, the first data storage device 120 may include Ge—Sb—Te (GST). A crystallization temperature, a melting point, a phase change speed in accordance with crystallization energy, or the like of the first data storage device 120 may be determined in accordance with types of elements included in the first data storage device 120 and a chemical composition ratio of the elements.

The second memory cell MC2 may have a structure similar to a structure of the first memory cell MC1. Referring to FIG. 3, the second memory cell MC2 may include a second heating electrode 140, a second data storage device 150, a second switching device 160, and the like. Structures and configurations of the second heating electrode 140, the second data storage device 150, and the second switching device 160 may be similar to those of the first heating electrode 110, the first data storage device 120, and the first switching device 130, respectively. In the description below, a method of writing and erasing data will be described with reference to the first memory cell MC1 as an example.

When a voltage is applied through the first word line 101 and the bit line 102, joule heat may be generated on an interfacial surface between the first heating electrode 110 and the first data storage device 120 due to the voltage. Due to the joule heat, a phase of a phase change material included in the first data storage device 120 may be changed from an amorphous phase to a crystalline phase or from a crystalline phase to an amorphous phase. The first data storage device 120 may have relatively great resistance in an amorphous phase, and may have relatively small resistance in a crystalline phase. In an exemplary embodiment of the present inventive concept, data "0" or "1" may be defined in accordance with a resistance value of the first data storage device 120.

To write data in the first memory cell MC1, a program voltage may be supplied through the first word line 101 and the bit line 102. The program voltage may be greater than a threshold voltage of an ovonic threshold switch material included in the first switching device 130, and accordingly, a current may flow through the first switching device 130. The phase of the phase change material included in the first data storage device 120 may be changed from an amorphous phase to a crystalline phase by the program voltage, and accordingly, data may be written in a first memory region. In an exemplary embodiment of the present inventive concept, when the phase change material included in the first data storage device 120 has a crystalline phase, a state of the first memory cell MC1 may be defined as a set state SET.

To erase data written in the first memory cell MC1, the phase of the phase change material included in the first data storage device 120 may be restored from the crystalline phase to the amorphous phase. As an example, a predetermined erasing voltage may be supplied through the first word line 101 and the bit line 102. By the erasing voltage, the phase of the phase change material included in the first data storage device 120 may be changed from the crystalline phase to the amorphous phase. When the phase change material included in the first data storage device 120 has the amorphous phase, a state of the first memory cell MC1 may be defined as a reset state RESET. As an example, a maximum value of the erasing voltage may be greater than a maximum value of the program voltage, and a time for which the erasing voltage is supplied may be shorter than a time for which the program voltage is supplied.

As described above, resistance values of the data storage devices 120 and 150 may change in accordance with a state of the phase change material included in the data storage devices 120 and 150, and a memory controller may distinguish data "0" and "1" from each other based on the resistance values of the data storage devices 120 and 150. Thus, the greater the difference in resistance between the data storage devices 120 and 150 generated in accordance with a phase of the phase change material included in the data storage devices 120 and 150, the more accurately the memory controller may write or read out data.

Figure 4:
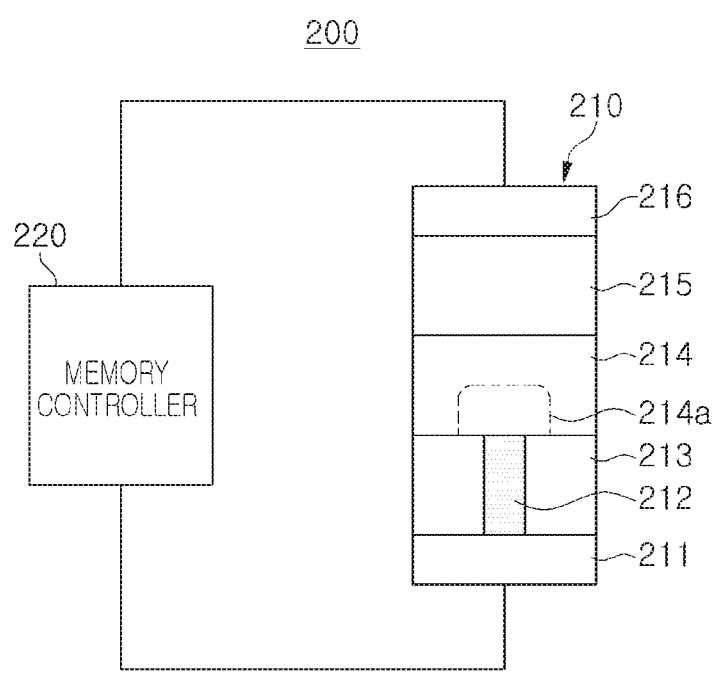
FIG. 4 is a diagram illustrating an operation of a memory device according to an exemplary embodiment of the present inventive concept.

FIG. 4 is a diagram illustrating an operation of a memory device according to an exemplary embodiment of the present inventive concept. Referring to FIG. 4, a memory device 200 in the present exemplary embodiment may operate by power supplied by a memory controller 220 to a memory cell 210. The memory cell 210 may include a lower electrode 211, a heating electrode 212, a data storage device 214, a switching device 215, an upper electrode 216, and other elements. The lower electrode 211 and the upper electrode 216 may be supplied with voltage output by the memory controller 220 through a word line, a bit line, or the like. An insulating layer 213 may be disposed around the heating electrode 212, and a phase may change by the power supplied by the memory controller 220 in a partial region 214a of the data storage device 214 adjacent to the heating electrode 212.

In an exemplary embodiment of the present inventive concept, a readout operation for identifying data of the memory cell 210 may be executed by inputting a predetermined bias voltage to each of the lower electrode 211 and the upper electrode 216. To prevent a state of the data storage device 214 from being unintentionally changed in the memory cell 210 by the readout operation, a current flowing in the memory cell 210 during the readout operation may be smaller than a current flowing during a program operation. As an example, the memory controller 220 may input a relatively great first voltage to the upper electrode 216 and may input a relatively small second voltage to the lower electrode 211 as bias voltages, and may detect a readout voltage in accordance with a resistance value of the memory cell 210. The memory controller 220 may determine a state of the memory cell 210 as a set state or a reset state by comparing the readout voltage with a predetermined reference voltage.

Figure 5A:
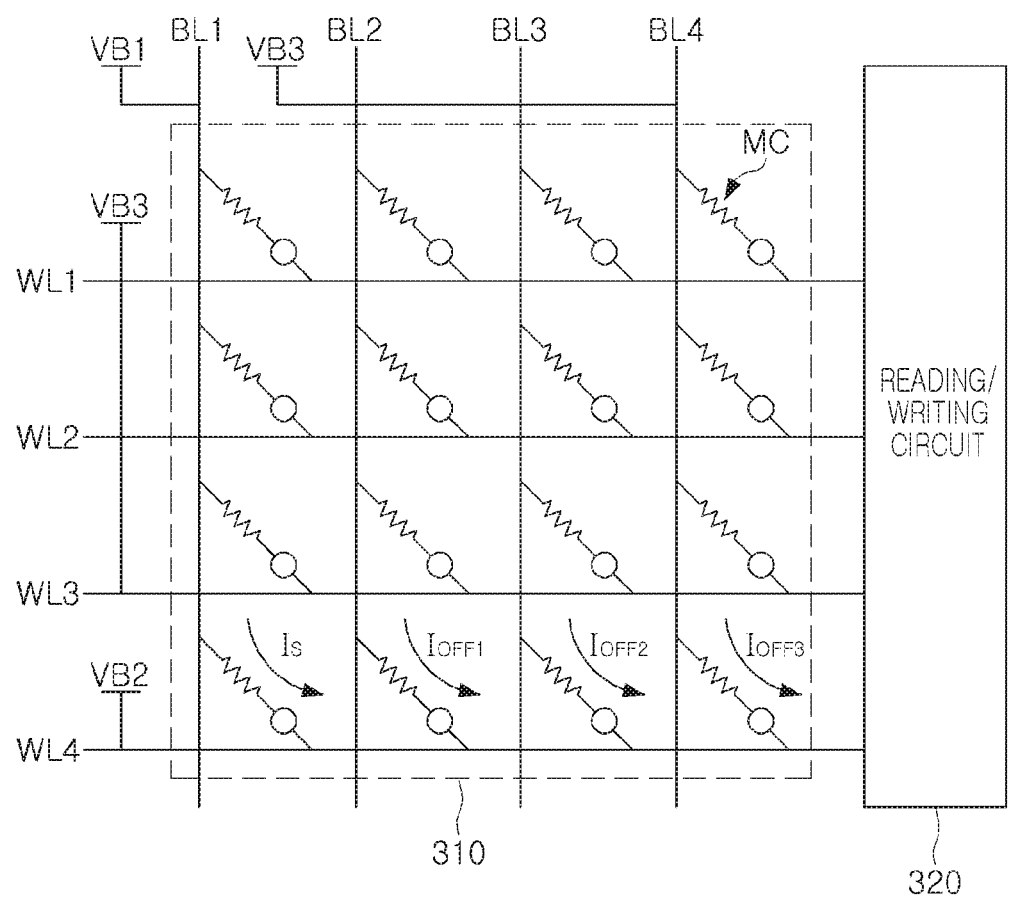
FIGS. 5A and 5B are diagrams illustrating a readout operation of a memory device according to exemplary embodiments of the present inventive concept.
Figure 5B:
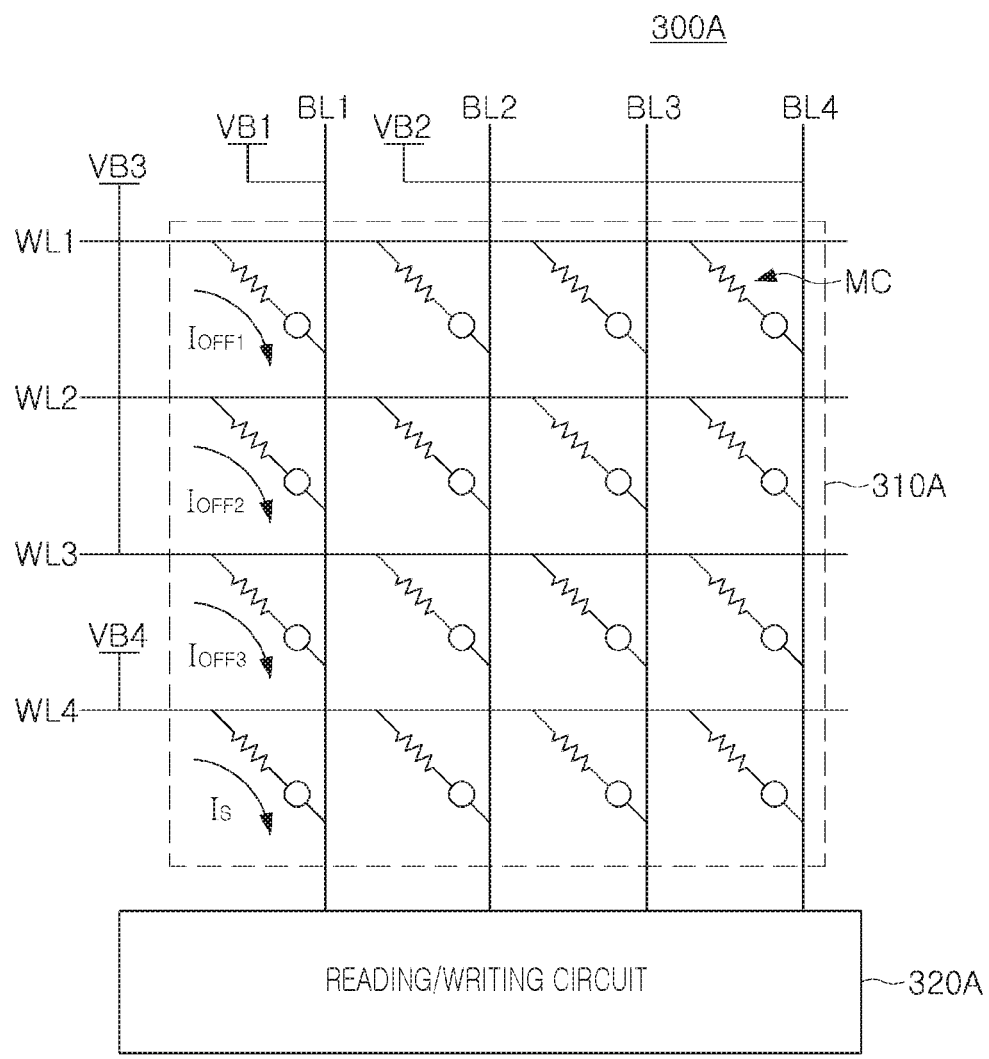

FIGS. 5A and 5B are diagrams illustrating a readout operation of a memory device according to exemplary embodiments of the present inventive concept.

Referring to FIG. 5A, a memory device 300 in the present exemplary embodiment may include a memory cell array 310 and a reading/writing circuit 320. The memory cell array 310 may include first to fourth bit lines BL1 to BL4, first to fourth word lines WL1 to WL4, and a plurality of memory cells MC. The plurality of memory cells MC may be disposed at points at which the first to fourth bit lines BL1 to BL4 intersect the fourth word lines WL1 to WL4, respectively.

In the present exemplary embodiment illustrated in FIG. 5A, the reading/writing circuit 320 may read out data from a selected memory cell connected to the first bit line BL1 and the fourth word line WL4. The first bit line BL1 connected to the selected memory cell may be configured as a selected bit line, and may receive a first voltage VB1. The fourth word line WL4 connected to the selected memory cell may be configured as a selected word line and may receive a second voltage VB2. A third voltage VB3 may be input to the second to fourth bit lines BL2 to BL4 and the first to third word lines WL1 and WL3 that are not connected to the selected memory cell. In an exemplary embodiment of the present inventive concept, magnitudes of the first to third voltages VB1 to VB3 may be defined according to Equation 1 below.

$$VB1 > VB3 > VB2 \quad \text{[Equation 1]}$$

As an example, the first voltage VB1 may be greater than the second voltage VB2, and the third voltage VB3 may be smaller than the first voltage VB1 and may be greater than the second voltage VB2.

In exemplary embodiments of the present inventive concept, magnitudes of the bias voltages input to the selected word line, the non-selected word lines, the selected bit line, and the non-selected bit lines are not limited to the example illustrated in FIG. 5A. As an example, magnitudes of the bias voltages input to the selected word line, the non-selected word lines, the selected bit line, and the non-selected bit lines may be different from one another. In other words, different from the non-selected bit lines, a fourth voltage VB4 may be input to the non-selected word lines, rather than the third voltage VB3. A magnitude of the fourth voltage VB4 may be different from a magnitude of the third voltage VB3, and may be smaller than the first voltage VB1 and greater than the second voltage VB2.

Accordingly, a difference between voltages applied to the selected memory cell may be greater than a difference between voltages applied to the non-selected memory cell, and ideally a current may only flow through the selected memory cell. The reading/writing circuit 320 may generate a readout voltage from a sensing current $I_S$ flowing in the selected memory cell and the fourth word line WL4, and may compare the readout voltage with a predetermined reference voltage, thus determining a state of the selected memory cell as a set state or a reset state.

However, a current may also flow through the non-selected memory cells in an actual readout operation of the memory device 300. In other words, off-currents $I_{OFF1}$ to $I_{OFF3}$ flowing from the second to fourth bit lines BL2 to BL4, the non-selected bit lines, to the fourth word line WL4, the selected word line, may be generated. A sum of the off-currents $I_{OFF1}$ to $I_{OFF3}$ may be defined as a leakage current, and the off-currents $I_{OFF1}$ to $I_{OFF3}$ may flow into the reading/writing circuit 320 through the fourth word line WL4. When the leakage current is generated, the readout voltage, generated by the reading/writing circuit 320 from a current flowing in the fourth word line WL4 to read out data of the selected memory cell, may increase. Accordingly, data of the selected memory cell in a reset state may not be accurately read out.

To address the issue described above, the memory device 300 may provide a circuit to compensate for the leakage current in the selected word line WL4. For example, to remove the leakage current corresponding to a sum of the off-currents $I_{OFF1}$ to $I_{OFF3}$ from the current input to the reading/writing circuit 320 from the selected word line WL4, the memory device 300 may provide a current path drawing a compensation current corresponding to the leakage current from the selected word line WL4.

However, the leakage current may be excessively removed from the sensing current $I_S$ over time. For example, when the leakage current is excessively removed from the sensing current $I_S$ flowing in the selected memory cell in a set state, a voltage of the selected word line WL4 may decrease. Accordingly, a sensing margin of a readout voltage of the selected memory cell in the set state may decrease, and an accuracy of the readout operation may not improve.

In an exemplary embodiment of the present inventive concept, by adjusting an enabling time point of a sense amplifier outputting a voltage difference between the readout voltage and the reference voltage, a sensing margin of the readout voltage of the selected memory cell in the set state may increase.

Different from the exemplary embodiment illustrated in FIG. 5A, the reading/writing circuit may be connected to the bit lines BL1 to BL4. In this case, a bias voltage may be input to each of the selected word line, the non-selected word lines, the selected bit line, and the non-selected bit lines for the off-currents $I_{OFF1}$ to $I_{OFF3}$ and the sensing current $I_S$ to flow from the word lines WL1 to WL4 to the bit lines BL1 to BL4. An exemplary embodiment thereof will be described with reference to FIG. 5B below.

Referring to FIG. 5B, a memory device 300A in the present exemplary embodiment may include a memory cell array 310A and a reading/writing circuit 320A. A structure of the memory cell array 310A may be similar to the exemplary embodiment of FIG. 5A. The plurality of memory cells MC may be disposed at points at which the first to fourth bit lines BL1 to BL4 intersect the first to fourth word lines WL1 to WL4, respectively.

The reading/writing circuit 320A may be connected to the first to fourth bit lines BL1 to BL4, and may read out data from a selected memory cell connected to the first bit line BL1 and the fourth word line WL4 in the present exemplary embodiment illustrated in FIG. 5B. The first bit line BL1 connected to the selected memory cell may be configured as a selected bit line, and may receive the first voltage VB1. The second to fourth bit lines BL2 to BL4, non-selected bit lines, may receive the second voltage VB2. The first to third word lines WL1 and WL3, non-selected word lines, may receive the third voltage VB3, and the fourth word line WL4, a selected word line, may receive a fourth voltage VB4. In an exemplary embodiment of the present inventive concept, magnitudes of the first to fourth voltages VB1 to VB4 may be defined according to Equation 2 below.

$$VB4 > VB2 > VB3 > VB1 \quad \text{[Equation 2]}$$

For example, the first voltage VB1 input to the first bit line BL1 may be a ground voltage, and the fourth voltage VB4 input to the fourth word line WL4 may be a power voltage, VDD. The second voltage VB2 may be ⅔*VDD, and the third voltage VB3 may be ⅓*VDD. A voltage difference of VDD may be applied to both ends of the selected memory cell, and a voltage difference of ⅓*VDD may be applied to both ends of the non-selected memory cells. Accordingly, the selected memory cell may be turned on, and the non-selected memory cells may not be turned on.

However, as described in the aforementioned exemplary embodiment of FIG. 5A, in an actual readout operation of the memory device 300A, off-currents $I_{OFF1}$ to $I_{OFF3}$ flowing from the first to third word lines WL1 and WL3, the non-selected word lines, to the first bit line BL1, the selected bit line, may be generated. A sum of the off-currents $I_{OFF1}$ to $I_{OFF3}$ may be defined as the leakage current, and the off-currents $I_{OFF1}$ to $I_{OFF3}$ may flow into the reading/writing circuit 320 through the first bit line BL1.

As described with reference to FIG. 5A, data of the selected memory cell in the reset state may not be accurately read out due to the leakage current. Thus, the memory device 300 may provide a current path drawing a compensation current, corresponding to the leakage current, from the selected bit line.

However, the leakage current may be excessively removed from a sensing current (e.g., $I_S$) over time, and accordingly, a sensing margin of a readout voltage of the selected memory cell in the set state may decrease. Thus, in an exemplary embodiment of the present inventive concept, by adjusting an enabling time point of a sense amplifier outputting a voltage difference between the readout voltage and the reference voltage, the sensing margin of the readout voltage of the selected memory cell in the set state may increase.

Figure 6:
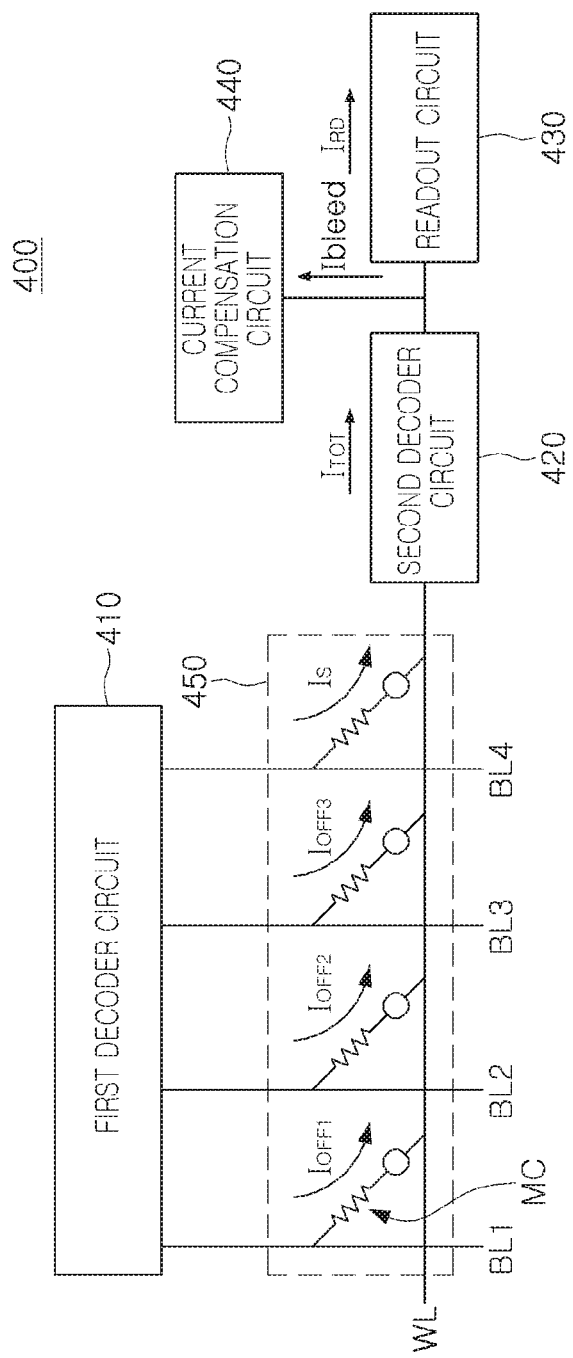
FIG. 6 is a block diagram illustrating a memory device according to an exemplary embodiment of the present inventive concept.

FIG. 6 is a block diagram illustrating a memory device according to an exemplary embodiment of the present inventive concept. Referring to FIG. 6, a memory device 400 in the present exemplary embodiment may include a first decoder circuit 410, a second decoder circuit 420, a readout circuit 430, a current compensation circuit 440, and a memory cell array 450. The memory cell array 450 may include the plurality of memory cells MC. The first decoder circuit 410 may be connected to the plurality of memory cells MC through the first to fourth bit lines BL1 to BL4, and the second decoder circuit 420 may be connected to the plurality of memory cells MC through the word line WL. For ease of description, only one word line WL is illustrated in the present exemplary embodiment of FIG. 6, but the inventive concept is not limited thereto. For example, the memory cell array 450 may include a plurality of word lines. Additionally, the number of the first to fourth bit lines BL1 to BL4 may be varied according to exemplary embodiments of the present inventive concept.

The readout circuit 430 in the present exemplary embodiment may read out data of a selected memory cell connected to the fourth bit line BL4. Accordingly, the fourth bit line BL4 may be determined as a selected bit line, and the first to third bit lines BL1 to BL3 may be non-selected bit lines. The first decoder circuit 410 may input a first voltage to the fourth bit line BL4 as a bias voltage, and the second decoder circuit 420 may input a second voltage smaller than the first voltage to the word line WL as a bias voltage. The first decoder circuit 410 may also input a third voltage, smaller than the first voltage and greater than the second voltage, to the first to third bit lines BL1 to BL3 as a bias voltage. As an example, the third voltage may be a voltage of 0V, the first voltage may be a positive voltage, and the second voltage may be a negative voltage. An absolute value of the first voltage may be substantially the same as an absolute value of the second voltage.

When bias voltages are input to the first to fourth bit lines BL1 to BL4 and the word line WL as described above, ideally a current may only flow in the selected memory cell in which a relatively great voltage difference is generated. The current flowing in the selected memory cell may be the sensing current $I_S$, and the readout circuit 430 may detect a readout voltage corresponding to the sensing current $I_S$ and may compare the readout voltage with a reference voltage, thus determining a state of the selected memory cell as a set state or a reset state.

In an actual operation, however, a current may also flow in each of the non-selected memory cells connected to the first to third bit lines BL1 to BL3. Referring to FIG. 6, a current flowing through the first to third bit lines BL1 to BL3, the non-selected memory cells, and the word line WL may be referred to as the off-currents $I_{OFF1}$ to $I_{OFF3}$. As the off-currents $I_{OFF1}$ to $I_{OFF3}$ are added to the sensing current $I_S$ through the word line WL, a total current $I_{TOT}$ transferred to the second decoder circuit 420 may increase. Accordingly, a readout voltage generated by a readout current $I_{RD}$ input to the readout circuit 430 may not sufficiently secure a sensing margin. Thus, the readout circuit 430 may not accurately determine a state of the selected memory cell.

Figure 7:
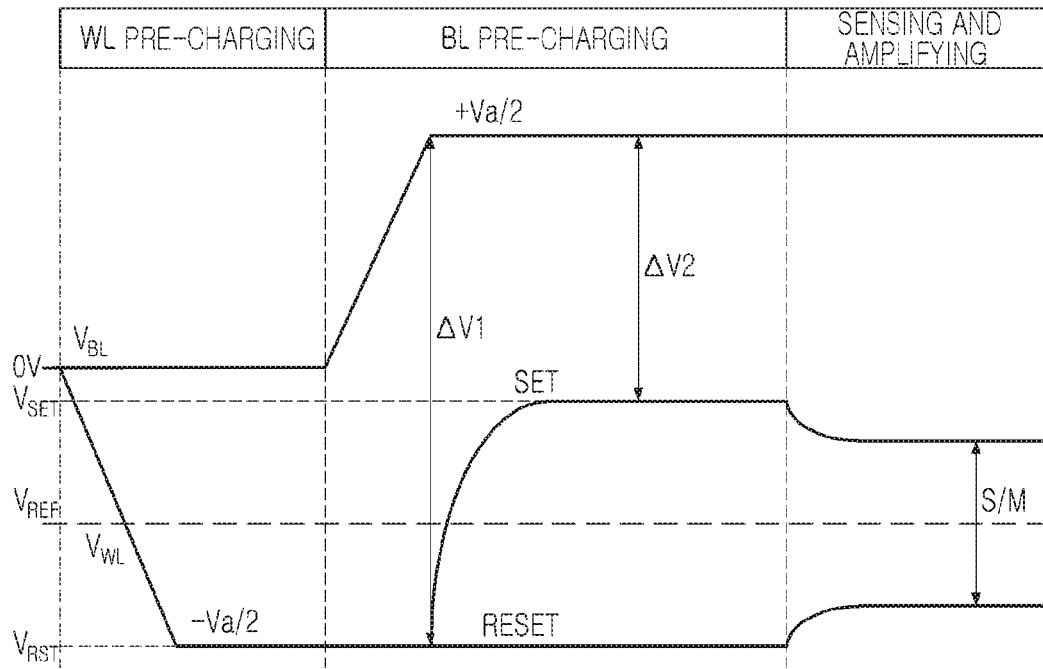
FIGS. 7 and 8 are graphs illustrating a voltage during a readout operation of a memory device according to an exemplary embodiment of the present inventive concept.
Figure 8:
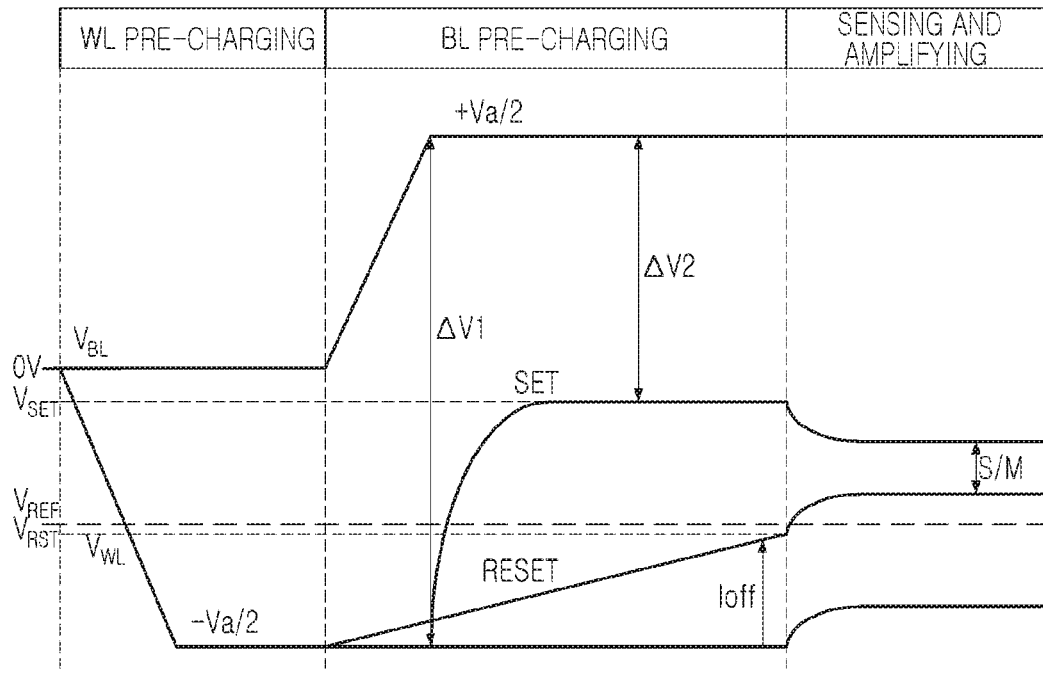

FIGS. 7 and 8 are graphs illustrating a voltage during a readout operation of a memory device according to an exemplary embodiment of the present inventive concept. FIG. 7 is an ideal graph illustrating an example in which a leakage current caused by non-selected memory cells is not present, and FIG. 8 is a graph illustrating an example in which a leakage current caused by non-selected memory cells is present. A readout operation may include a word line pre-charging section, a bit line pre-charging section, and a sensing amplifying section. "$V_{BL}$" may indicate a voltage of a selected bit line, and "$V_{WL}$" may indicate a voltage of a selected word line.

Referring to FIGS. 6 and 7, the second decoder circuit 420 may pre-charge a selected word line WL to a first voltage value (e.g., half of a negative readout voltage Va) in the word line pre-charging section.

The first decoder circuit 410 may pre-charge a selected bit line BL4 to a second voltage value (e.g., half of a readout voltage Va) in the bit-line pre-charging section. The selected word line WL may float in the bit line pre-charging section. When the selected bit line BL4 is pre-charged and the readout voltage Va is applied to both ends of a selected memory cell, a voltage graph may exhibit a different property depending on whether the selected memory cell is in a set state or in reset state.

When the selected memory cell is in the set state, and a voltage difference $\Delta V1$ between the selected bit line BL4 and the selected word line WL connected to the selected memory cell increases further than a first threshold voltage, the selected memory cell may be turned on. As an example, the first threshold voltage may refer to a voltage of a time point at which the selected memory cell is turned on.

When the selected memory cell is turned on, the voltage $V_{WL}$ of the selected word line may increase by the sensing current $I_S$ flowing through the selected memory cell. When the voltage $V_{WL}$ of the selected word line increases, and a voltage difference $\Delta V2$ between the selected bit line BL4 and the selected word line WL decreases to a second threshold voltage, the selected memory cell may be turned off. As an example, the second threshold voltage may refer to a voltage of a time point at which the selected memory cell turns into a turned-off state from a turned-on state. When the selected memory cell is turned off, the voltage $V_{WL}$ of the selected word line may be a set voltage $V_{SET}$.

When a state of the selected memory cell is a reset state, the selected memory cell may not be turned on and a leakage current flowing through the non-selected memory cells may not be present. Accordingly, the voltage $V_{WL}$ of the selected word line may not change. The voltage $V_{WL}$ of the selected word line may be a reset voltage $V_{RST}$.

The sense amplifier of the readout circuit 430 may output a voltage difference between the voltage $V_{WL}$ of the selected word line WL and a reference voltage $V_{REF}$ in a sensing amplifying section. As the reference voltage $V_{REF}$ may be a voltage between the set voltage $V_{SET}$ and the reset voltage $V_{RST}$, a sensing margin S/M of the readout voltage of the selected memory cell may be sufficiently secured with reference to the reference voltage $V_{REF}$ in the sensing amplifying section. Thus, even when a noise element entering from the outside is present, the readout circuit 430 may accurately determine a state of the selected memory cell.

As for the present exemplary embodiment illustrated in FIG. 8, only differences from the exemplary embodiment illustrated in FIG. 7 will be described. Referring to FIG. 8 along with FIG. 6, the second decoder circuit 420 may pre-charge the selected word line WL to a first voltage value (e.g., half of a negative readout voltage Va) in the word line pre-charging section.

A magnitude of a voltage applied to both ends of the selected memory cell may be different from a magnitude of a voltage applied to both ends of each of non-selected memory cells in the bit line pre-charging section. For example, the first decoder circuit 410 may pre-charge the selected bit line BL4 to a second voltage value (e.g., half of a readout voltage Va), and may input a voltage of 0V to the non-selected bit lines BL1 to BL3 as a bias voltage. Accordingly, in the bit line pre-charging section, the readout voltage Va may be applied to both ends of the selected memory cell, and half of the readout voltage Va may be applied to both ends of each of the non-selected memory cells connected to the selected word line WL.

Ideally, when the selected memory cell is in the reset state, the selected memory cell may not be turned on, and a leakage current flowing through the non-selected memory cells may not be present, and accordingly, the voltage $V_{WL}$ of the selected word line may not change. However, in an actual readout operation, by a voltage applied to both ends of each of the non-selected memory cells, the leakage current flowing through the non-selected memory cells may be generated. The leakage current flowing in the non-selected memory cells may be referred to as the off-currents $I_{OFF1}$ to $I_{OFF3}$, and may correspond to half of the readout voltage Va.

When the off-currents $I_{OFF1}$ to $I_{OFF3}$ flowing in the non-selected memory cells are combined and the combined off-current flows in the selected word line WL, the voltage $V_{WL}$ of the selected word line may increase to the reset voltage $V_{RST}$ due to the off-currents $I_{OFF1}$ to $I_{OFF3}$.

Accordingly, a sensing margin of the readout voltage of the selected memory cell in the reset state may decrease with reference to the reference voltage $V_{REF}$ in the sensing amplifying section. As the sensing margin of the readout voltage of the selected memory cell in the reset state decreases, the readout circuit 430 may inaccurately determine a state of the selected memory cell in the reset state as the set state.

Figure 9A:
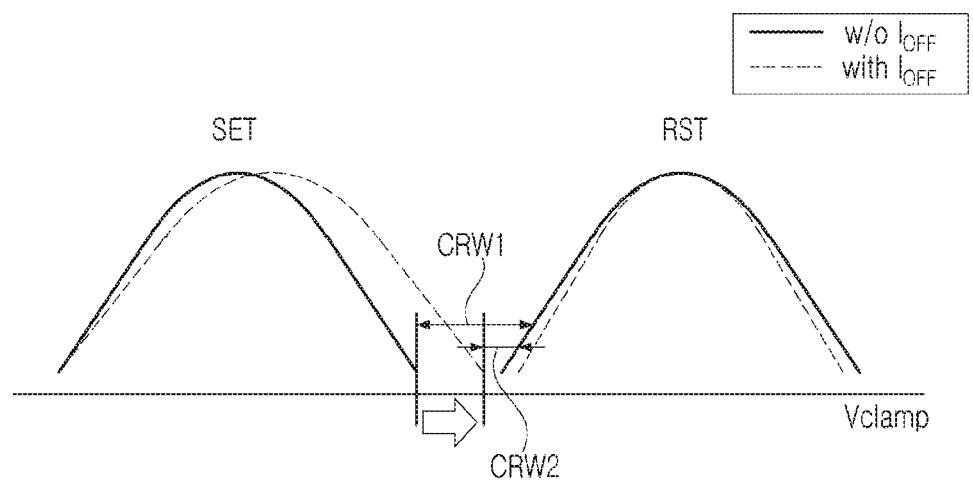
FIGS. 9A and 9B are graphs illustrating a decrease of a readout window and a decrease of a sensing margin caused by a leakage current of a memory device according to an exemplary embodiment of the present inventive concept.
Figure 9B:
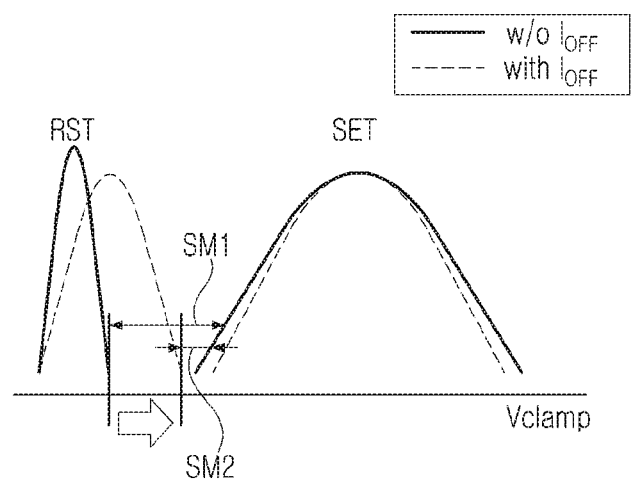

FIGS. 9A and 9B are graphs illustrating a decrease of a readout window and a decrease of a sensing margin caused by a leakage current of a memory device according to an exemplary embodiment of the present inventive concept. In the graph of FIGS. 9A and 9B, Vclamp (the x-axis) may refer to a voltage for pre-charging a selected bit line.

Referring to FIG. 9A along with FIG. 8, as the voltage $V_{WL}$ of a selected word line increases, a magnitude of a voltage applied to both ends of a selected memory cell may substantially decrease. In other words, an effective value of the readout voltage Va may substantially decrease. As the effective value of the readout voltage Va substantially decreases, a distribution of memory cells in the set state may be spread to the right side with reference to the Vclamp axis, and accordingly, a readout window may decrease (from CRW1 to CRW2), and the memory device may determine a state of the memory cell in the set state as the reset state.

Referring to FIG. 9B along with FIG. 8, as the voltage $V_{WL}$ of the selected word line increases, a distribution of memory cells in the reset state may be spread to the right side with reference to the Vclamp axis. Accordingly, a sensing margin of the readout voltage of the selected memory cell in the reset state may decrease (from SM1 to SM2), and the memory device may determine a state of the memory cell in the reset state as the set state.

Referring back to FIG. 6, the issues described in the aforementioned exemplary embodiments of FIGS. 8 and 9 may be addressed using a current compensation circuit 440. The current compensation circuit 440 may be connected to an input terminal of the readout circuit 430, and may provide a current path drawing a compensation current Ibleed, corresponding to a leakage current in the total current $I_{TOT}$ flowing in the selected word line WL, from the selected word line WL.

In exemplary embodiments of the present inventive concept, magnitudes of the compensation current Ibleed may be varied. As an example, the compensation current Ibleed may have a constant magnitude. For example, the compensation current Ibleed may be greater than 0 and smaller than 10 µA. Additionally, in an exemplary embodiment of the present inventive concept, the compensation current Ibleed may be 1 µA to 3 µA.

For example, the compensation current Ibleed may correspond to a sum of the off-currents $I_{OFF1}$ to $I_{OFF3}$ generated in a worst case. For example, the compensation current Ibleed may have a magnitude corresponding to a magnitude of the leakage current having the greatest magnitude. As the current compensation circuit 440 compensates for the leakage current in the total current $I_{TOT}$, the readout current $I_{RD}$ input to the readout circuit 430 may generate a readout voltage by which a sensing margin may be sufficiently secured.

In exemplary embodiments of the present inventive concept, the compensation current Ibleed may have a magnitude substantially the same as a magnitude of a sum of the off-currents $I_{OFF1}$ to $I_{OFF3}$. To remove a current having a magnitude substantially the same as a magnitude of the sum of the off-currents $I_{OFF1}$ to $I_{OFF3}$ as the leakage current, the current compensation circuit 440 may include a circuit detecting and mirroring currents of the first to third bit lines BL1 to BL3 (the non-selected bit lines) through the first decoder circuit 410. As the current compensation circuit 440 removes the leakage current from the total current $I_{TOT}$, the readout current $I_{RD}$ input to the readout circuit 430 may have a magnitude substantially the same as a magnitude of the sensing current $I_S$ flowing through the selected memory cell.

Accordingly, in an exemplary embodiment of the present inventive concept, by compensating for the off-currents $I_{OFF1}$ to $I_{OFF3}$ flowing in the non-selected memory cells using the current compensation circuit 440, accuracy of a readout operation may improve. However, when the current compensation circuit 440 compensates for the leakage current using the compensation current Ibleed having a constant magnitude, the leakage current may be excessively removed from the sensing current $I_S$ over time. Accordingly, the readout current $I_{RD}$ input to the readout circuit 430 may decrease, and accordingly, a sensing margin of the readout voltage of the selected memory cell in the set state may decrease. As such, the memory device 400 may determine a state of the memory cell in the set state as the reset state.

In the present exemplary embodiment, the readout circuit 430 may compare a voltage of the selected word line WL with the reference voltage $V_{REF}$ in the bit line pre-charging section, and may enable the sense amplifier at a time point at which the voltage of the selected word line WL is greater than the reference voltage $V_{REF}$. In other words, by moving up the time point at which the sense amplifier is enabled to a time point at which the voltage of the selected word line WL is greater than the reference voltage $V_{REF}$, the sense amplifier may be prevented from being enabled at a time point at which the voltage of the selected word line WL is smaller than the reference voltage $V_{REF}$. Accordingly, a sensing margin of the readout voltage of the selected memory cell in the set state may be sufficiently secured.

Figure 10:
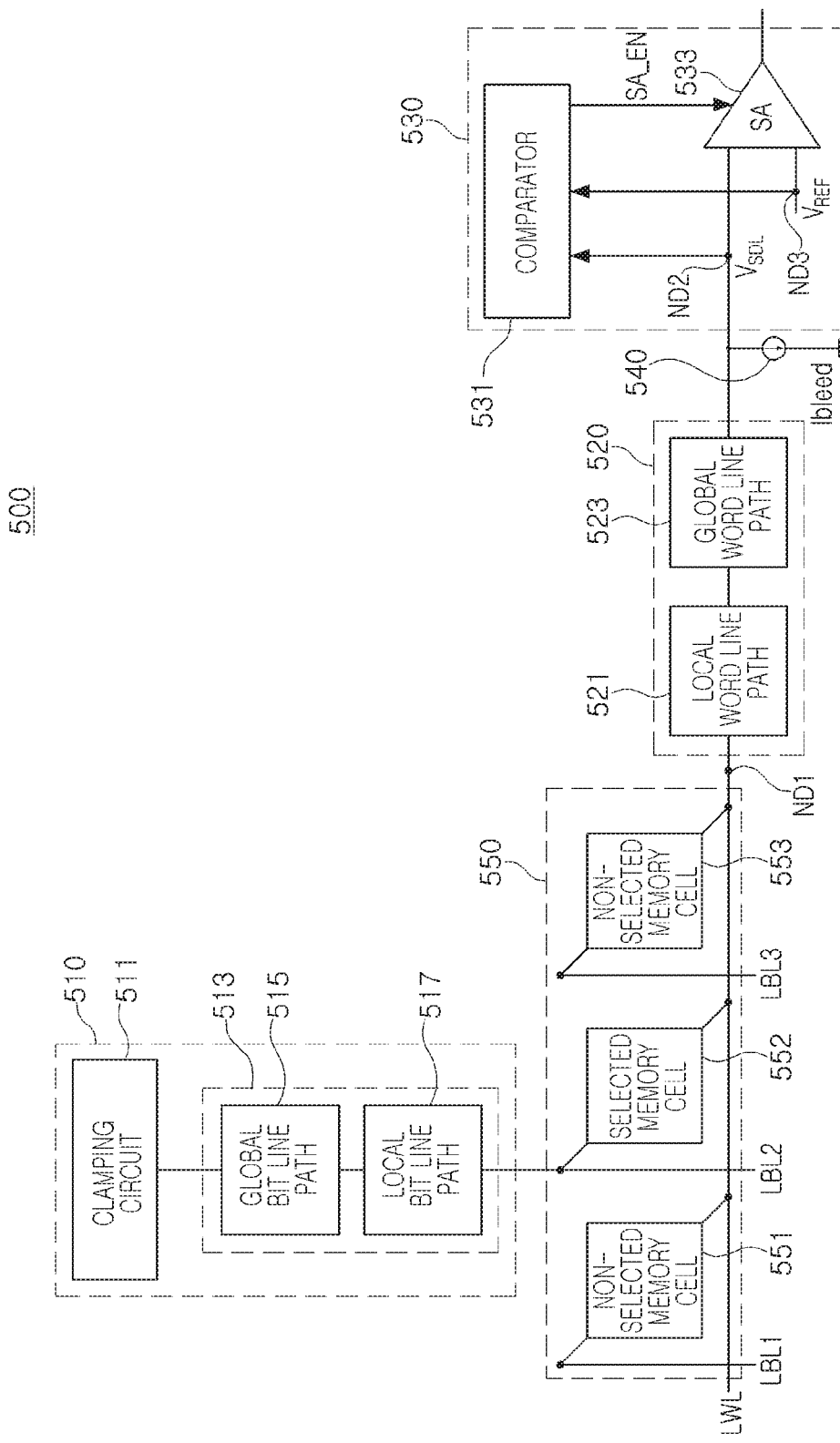
FIG. 10 is a circuit diagram illustrating a memory device according to an exemplary embodiment of the present inventive concept.
Figure 11:
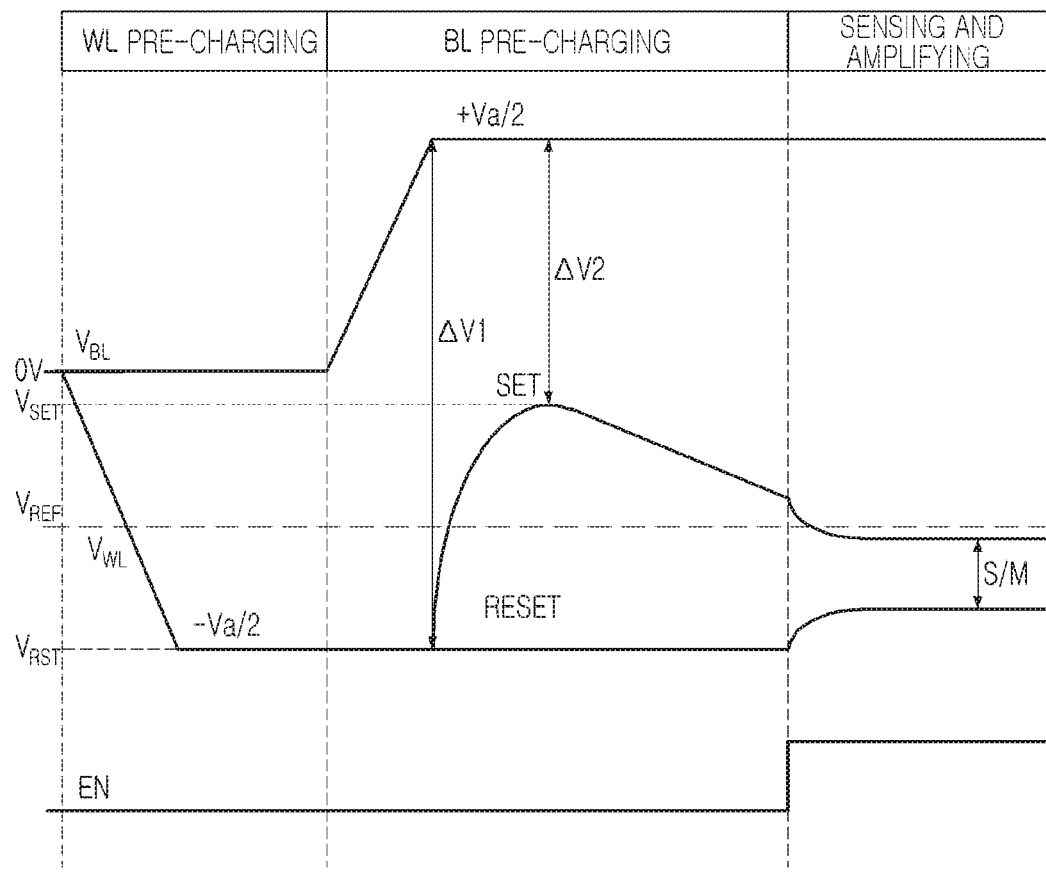
FIG. 11 is a graph illustrating the memory device of FIG. 10 according to an exemplary embodiment of the present inventive concept.

FIG. 10 is a circuit diagram illustrating a memory device according to an exemplary embodiment of the present inventive concept. FIG. 11 is a graph illustrating the memory device of FIG. 10 according to an exemplary embodiment of the present inventive concept. Referring to FIG. 10, a memory device 500 in the present exemplary embodiment may include a first decoder circuit 510, a second decoder circuit 520, a readout circuit 530, a current compensation circuit 540, and a memory cell array 550.

The first decoder circuit 510 may be connected to local bit lines LBL1-LBL3, and may input a bias voltage to each of the local bit lines LBL1-LBL3 to perform control operations such as a readout operation, a writing operation, an erasing operation, or the like. In the present exemplary embodiment illustrated in FIG. 10, it may be assumed that the readout circuit 530 may execute a readout operation of reading out data of a selected memory cell 552, and the local bit line LBL2 connected to the selected memory cell 552 may be referred to as a selected bit line, and the local bit lines LBL1 and LBL3 connected to non-selected memory cells 551 and 553 may be referred to as non-selected bit lines.

The first decoder circuit 510 may include a clamping circuit 511 and a bit line path 513. An electrical path from a node connected to the selected memory cell 552 and the local bit line LBL2 to the clamping circuit 511 may be referred to as the bit line path 513. In the present exemplary embodiment, the bit line path 513 connected to the selected memory cell 552 may be referred to as a selected bit line path. The selected bit line path 513 may include a local bit line path 517 indicating an electrical path on the selected local bit line LBL2, and a global bit line path 515 indicating an electrical path on a selected global bit line.

An electrical path from a node connected to the selected memory cell 552 and a local word line LWL to the readout circuit 530 may be referred to as word line paths 521 and 523. In the present exemplary embodiment, the word line paths 521 and 523 connected to the selected memory cell 552 may be referred to as a selected word line path. The local word line LWL may be referred to as a selected local word line. The selected word line paths 521 and 523 may include a local word line path 521 indicating an electrical path on the selected local word line LWL, and a global word line path 523 indicating an electrical path on a selected global word line.

The plurality of non-selected memory cells 551 and 553 may be connected to the selected local word line LWL, and a magnitude of voltage of the selected local word line LWL may increase by leakage currents generated by the plurality of non-selected memory cells 551 and 553.

As the current compensation circuit 540 is connected to the word line paths 521 and 523, the current compensation circuit 540 may provide a current path drawing the compensation current Ibleed, corresponding to a sum of off-currents generated by the non-selected memory cells 551 and 553, from the selected local word line LWL.

FIG. 10 illustrates an example in which the current compensation circuit 540 provides a compensation current having a constant magnitude, but the inventive concept is not limited thereto. The current compensation circuit 540 may also provide the compensation current Ibleed of which a magnitude changes in accordance with a magnitude of a sum of the off-currents.

Referring to FIGS. 10 and 11, as the current compensation circuit 540 compensates for the leakage current using the compensation current Ibleed, a sensing margin of the readout voltage of the selected memory cell in a reset state may be sufficiently secured. However, the leakage current may be excessively removed from a sensing current flowing in the selected memory cell in a set state over time. When the leakage current is excessively removed from the sensing current flowing in the selected memory cell in the set state, the voltage $V_{WL}$ of the selected word line may decrease. Accordingly, the sensing margin of the readout voltage of the selected memory cell in the set state may decrease, and the readout circuit 530 may inaccurately determine a state of the selected memory cell in the set state as the reset state.

The readout circuit 530 in the present exemplary embodiment may include a first sense amplifier 531 and a second sense amplifier 533. The first sense amplifier 531 may be configured as a static sense amplifier, and the second sense amplifier 533 may be configured as a dynamic sense amplifier, but the inventive concept is not limited thereto. The first sense amplifier 531 may perform an operation of a comparator.

A voltage applied to a first node ND1 may be a voltage of a selected local word line SWL (e.g., LWL), and the selected word line paths 521 and 523 and the current compensation circuit 540 may be connected to a second node ND2. An electrical path from the second node ND2, connected to the selected word line paths 521 and 523 and the current compensation circuit 540, to a first terminal of the second sense amplifier 533 may be referred to as a selected data line path. A third node ND3 may be disposed between a reference voltage source supplying the reference voltage $V_{REF}$ and a second terminal of the second sense amplifier 533. When the selected local word line SWL floats, a voltage of the selected local word line may be the same as a voltage $V_{SDL}$ of the selected data line path.

In exemplary embodiments of the present inventive concept, for the selected word line SWL to be in a floating state, a switch included in the local word line path 521 and a switch included in the global word line path 523 may be in a turned-on state after the selected word line SWL is pre-charged. The local word line path 521, the global word line path 523, and the selected data line path may not be connected to a circuit other than the current compensation circuit 540.

In exemplary embodiments of the present inventive concept, while the selected word line SWL floats, capacitance of the global word line path 523 may be smaller than capacitance of the global bit line path 515.

In exemplary embodiments of the present inventive concept, for the selected word line SWL to be in a floating state, the selected word line SWL may be separated from the second sense amplifier 533.

The first sense amplifier 531 may include a first terminal and a second terminal. The first terminal of the first sense amplifier 531 may be connected to the second node ND2, and may receive the voltage $V_{SDL}$ of the selected data line path from the second node ND2. The second terminal of the first sense amplifier 531 may be connected to the third node ND3, and may receive the reference voltage $V_{REF}$ from the third node ND3. The first sense amplifier 531 may compare the voltage $V_{SDL}$ of the selected data line path with the reference voltage $V_{REF}$. The first sense amplifier 531 may output an enable signal SA_EN adjusting an operating time of the second sense amplifier 533 when the voltage $V_{SDL}$ of the selected data line path is greater than the reference voltage $V_{REF}$.

The second sense amplifier 533 may be enabled in response to the enable signal SA_EN. The second sense amplifier 533 may receive the voltage $V_{SDL}$ of the selected data line path and the reference voltage $V_{REF}$ in response to the enable signal SA_EN, and may output a voltage difference between the voltage $V_{SDL}$ of the selected data line path and the reference voltage $V_{REF}$. For example, when the selected memory cell is in the set state, the second sense amplifier 533 may be enabled when the voltage $V_{SDL}$ of the selected data line path is greater than the reference voltage $V_{REF}$, and may output data "1". When the selected memory cell is in the reset state, the second sense amplifier 533 may output data "0" at a predetermined time point.

In the present exemplary embodiment, the first sense amplifier 531 may monitor the voltage $V_{SDL}$ of the selected data line path and the reference voltage $V_{REF}$. The first sense amplifier 531 may output the enable signal SA_EN, for adjusting an operating time of the second sense amplifier 533, to the second sense amplifier 533 when the voltage $V_{SDL}$ of the selected data line path is greater than the reference voltage $V_{REF}$. Thus, the memory device 500 in the present exemplary embodiment may move up a time point at which the second sense amplifier 533 is enabled to a time point at which the voltage $V_{SDL}$ of the selected data line path is greater than the reference voltage $V_{REF}$ when reading out data stored in the selected memory cell in the set state. Accordingly, the second sense amplifier 533 may be prevented from being enabled at a time point at which the voltage $V_{SDL}$ of the selected data line path is smaller than the reference voltage $V_{REF}$, thus increasing a sensing margin of the readout voltage of the selected memory cell in the set state.

Figure 12:
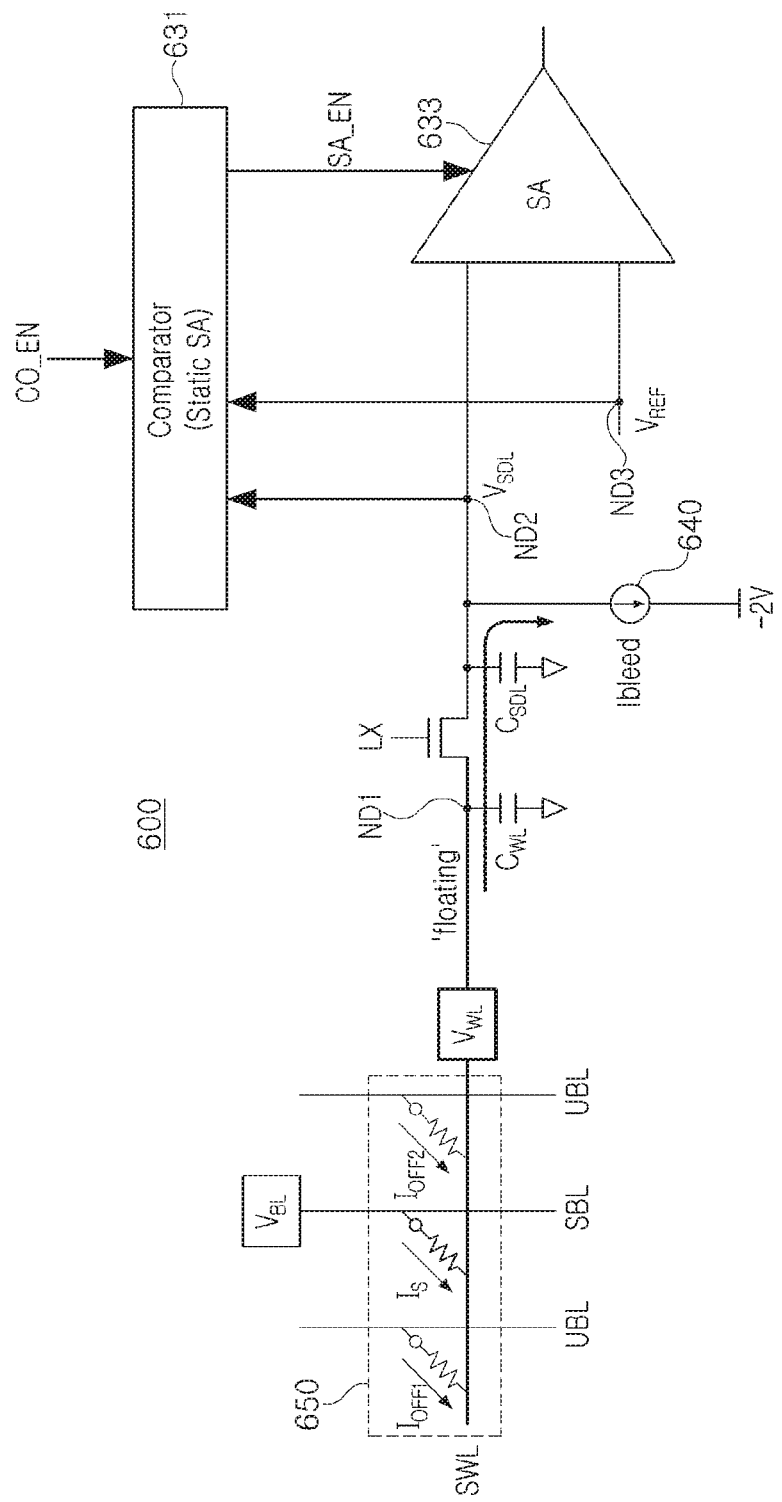
FIG. 12 is a circuit diagram illustrating a memory device according to an exemplary embodiment of the present inventive concept.
Figure 13:
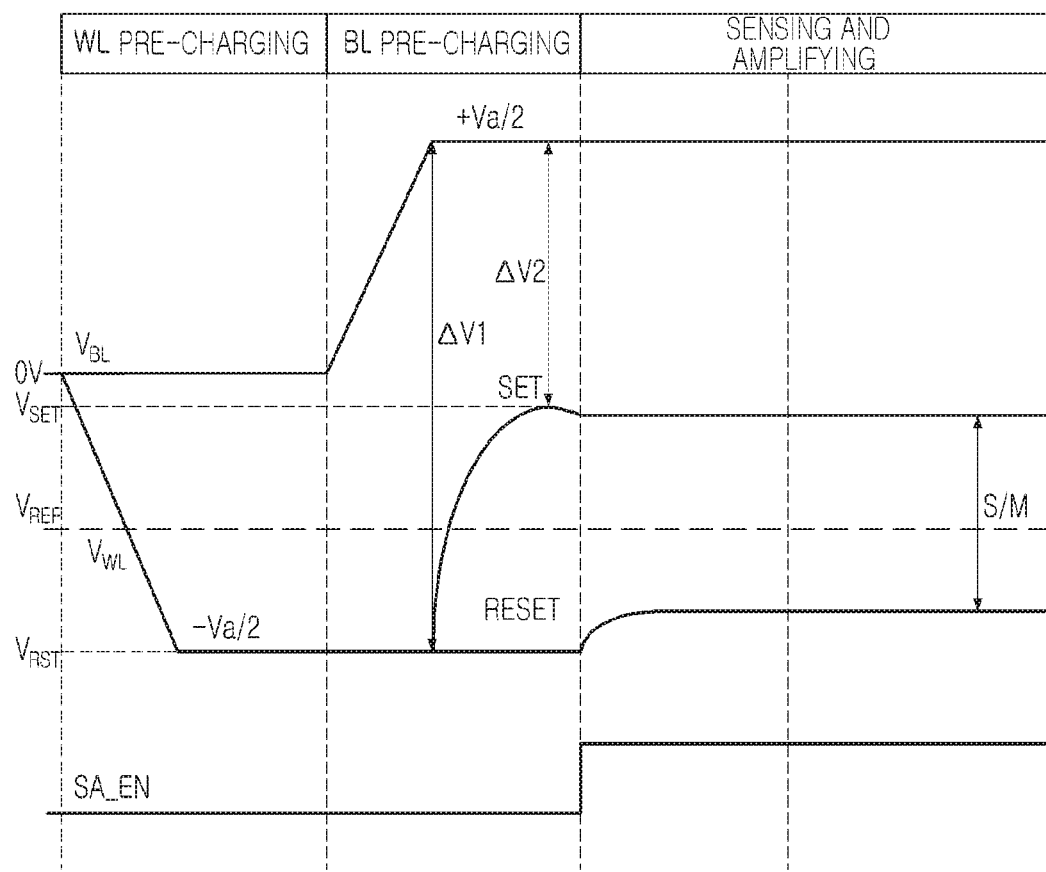
FIG. 13 is a graph illustrating the memory device of FIG. 12 according to an exemplary embodiment of the present inventive concept.

FIG. 12 is a circuit diagram illustrating a memory device according to an exemplary embodiment of the present inventive concept. FIG. 13 is a graph illustrating the memory device of FIG. 12 according to an exemplary embodiment of the present inventive concept. Referring to FIGS. 12 and 13, a memory device 600 may include a memory cell array 650, a local word line switch LX disposed in a local word line path, a current compensation circuit 640, a first sense amplifier 631, and a second sense amplifier 633.

In the word line pre-charging section, the local word line switch LX may be in a turned-on state, and the selected word line SWL may be pre-charged. After the selected word line SWL is pre-charged, the local word line switch LX may be in a turned-on state, and a selected bit line SBL may be pre-charged in the bit line pre-charging section. Unselected bit lines are indicated by "UBL."

When a state of a selected memory cell is in a set state, and a voltage difference $\Delta V1$ between the selected bit line SBL and the selected word line SWL connected to the selected memory cell is greater than a first threshold voltage $\Delta V1$, the selected memory cell may be turned on. When the selected memory cell is turned on, the sensing current $I_S$ flowing in the selected memory cell and a leakage current, e.g., a sum of the off-currents $I_{OFF1}$ to $I_{OFF3}$, flowing in non-selected memory cells, may flow in the selected word line SWL.

Parasitic capacitance $C_{WL}$ included in the selected word line SWL may increase by the sensing current $I_S$ and the leakage current, and the voltage $V_{WL}$ of the selected word line SWL may increase. When the voltage $V_{WL}$ of the selected word line SWL increases and a voltage difference $\Delta V2$ between the selected bit line SBL and the selected word line SWL decreases to a second threshold voltage, the selected memory cell may be turned off. When the selected memory cell is turned off, the voltage $V_{WL}$ of the selected word line may be the set voltage $V_{SET}$.

When the local word line switch LX is in a turned-on state and the selected word line SWL floats in the bit line pre-charging section, the parasitic capacitance $C_{WL}$ included in the selected data line path may increase such that the voltage $V_{SDL}$ of the selected data line path of the second node ND2 may be substantially the same as the voltage $V_{WL}$ of the selected word line SWL of the first node ND1.

In exemplary embodiments of the present inventive concept, in the bit line pre-charging section, when the local word line switch LX is in a partially turned-on state or a turned-off state and the selected word line SWL floats, the voltage $V_{SDL}$ of the selected data line path of the second node ND2 may be different from the voltage $V_{WL}$ of the selected word line SWL of the first node ND1. When the local word line switch LX receives a gate voltage smaller than a threshold voltage of the local word line switch LX and greater than a ground voltage, the local word line switch LX is in a partially turned-on state.

For example, when a magnitude of the compensation current Ibleed is constant, the local word line switch LX may be completely turned on, and when a magnitude of the compensation current Ibleed corresponds to a sum of off-currents (e.g., $I_{OFF1}$ and $I_{OFF2}$), the local word line switch LX may be partially turned on. However, the inventive concept is not limited thereto.

The current compensation circuit 440 may compensate for off-currents flowing in the non-selected memory cells using the compensation current Ibleed having a constant magnitude. Accordingly, as the leakage current may be excessively removed from the sensing current $I_S$ flowing in the selected memory cell in the set state over time, the voltage $V_{SDL}$ of the selected data line path may decrease. Thus, when the second sense amplifier 533 is enabled at a time point at which the voltage $V_{SDL}$ of the selected data line path is smaller than the reference voltage $V_{REF}$, a state of the memory cell in the set state may be inaccurately determined as the reset state.

The first sense amplifier 631 in the present exemplary embodiment may monitor the voltage $V_{SDL}$ of the selected data line path and the reference voltage $V_{REF}$ in the bit line pre-charging section. When the voltage $V_{SDL}$ of the selected data line path is greater than the reference voltage $V_{REF}$, the first sense amplifier 631 may output the enable signal SA_EN for adjusting an operating time of the second sense amplifier 633. The second sense amplifier 633 may be enabled in response to the enable signal SA_EN, and may output data "1".

Accordingly, the first sense amplifier 631 may control the second sense amplifier 633 to output a difference between the voltage $V_{SDL}$ of the selected data line path and the reference voltage $V_{REF}$ when the voltage $V_{SDL}$ of the selected data line path is greater than the reference voltage $V_{REF}$, thus preventing a sensing margin of a read voltage of the selected memory cell in the set state from being reduced. Accordingly, accuracy of the read operation may improve.

When a state of the selected memory cell is the reset state, the selected memory cell may not be turned on, and the leakage current flowing through the non-selected memory cells may be compensated by the current compensation circuit 640. The second sense amplifier 633 may be enabled at a certain point, and may output data "0".

In the present exemplary embodiment, as the second sense amplifier 633 is controlled to output a difference between the voltage $V_{WL}$ of the selected word line SWL and the reference voltage $V_{REF}$ in the bit line pre-charging section, a combination of the bit line pre-charging section and the sensing amplifying section may be referred to as a sensing section.

Figure 14A:
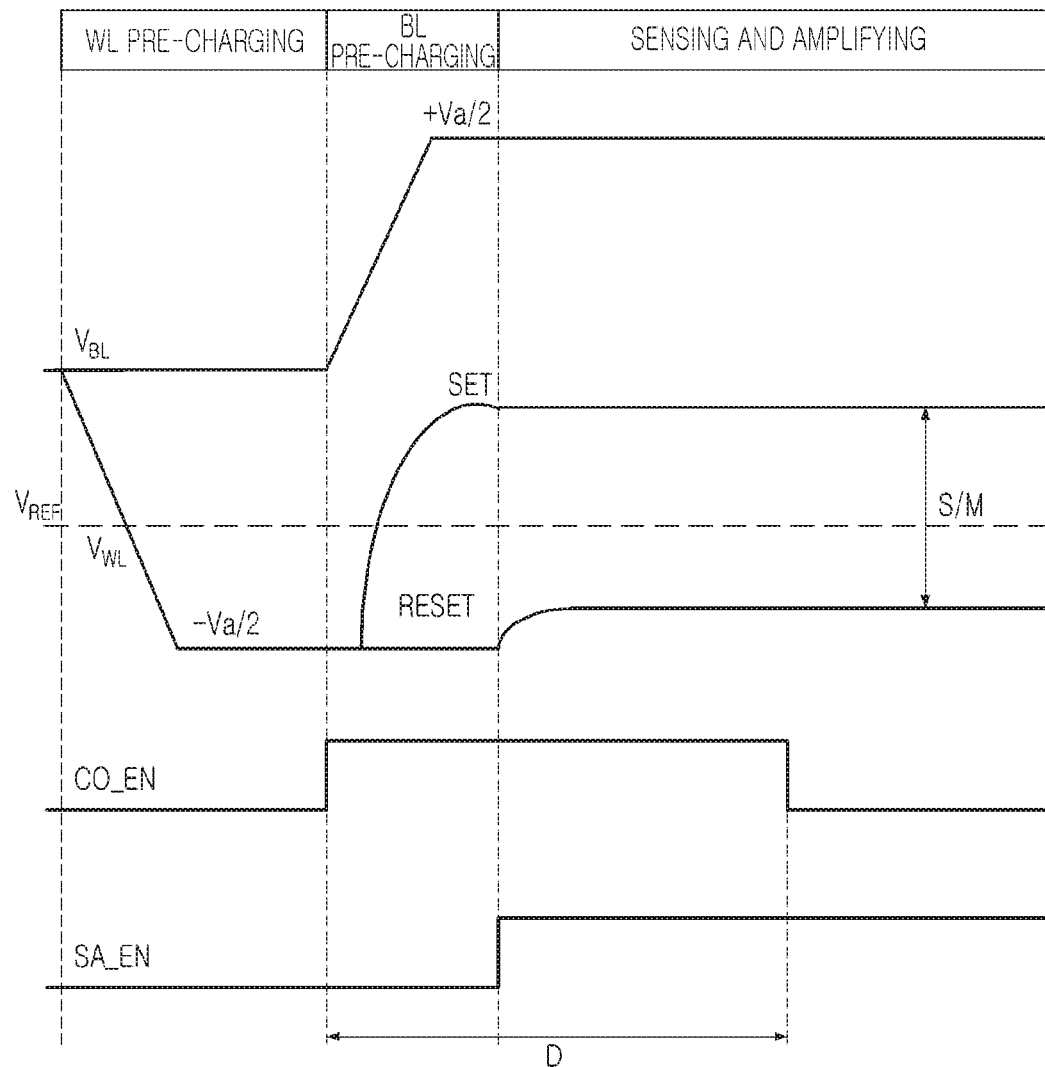
FIGS. 14A and 14B are graphs illustrating a memory device according to exemplary embodiments of the present inventive concept.
Figure 14B:
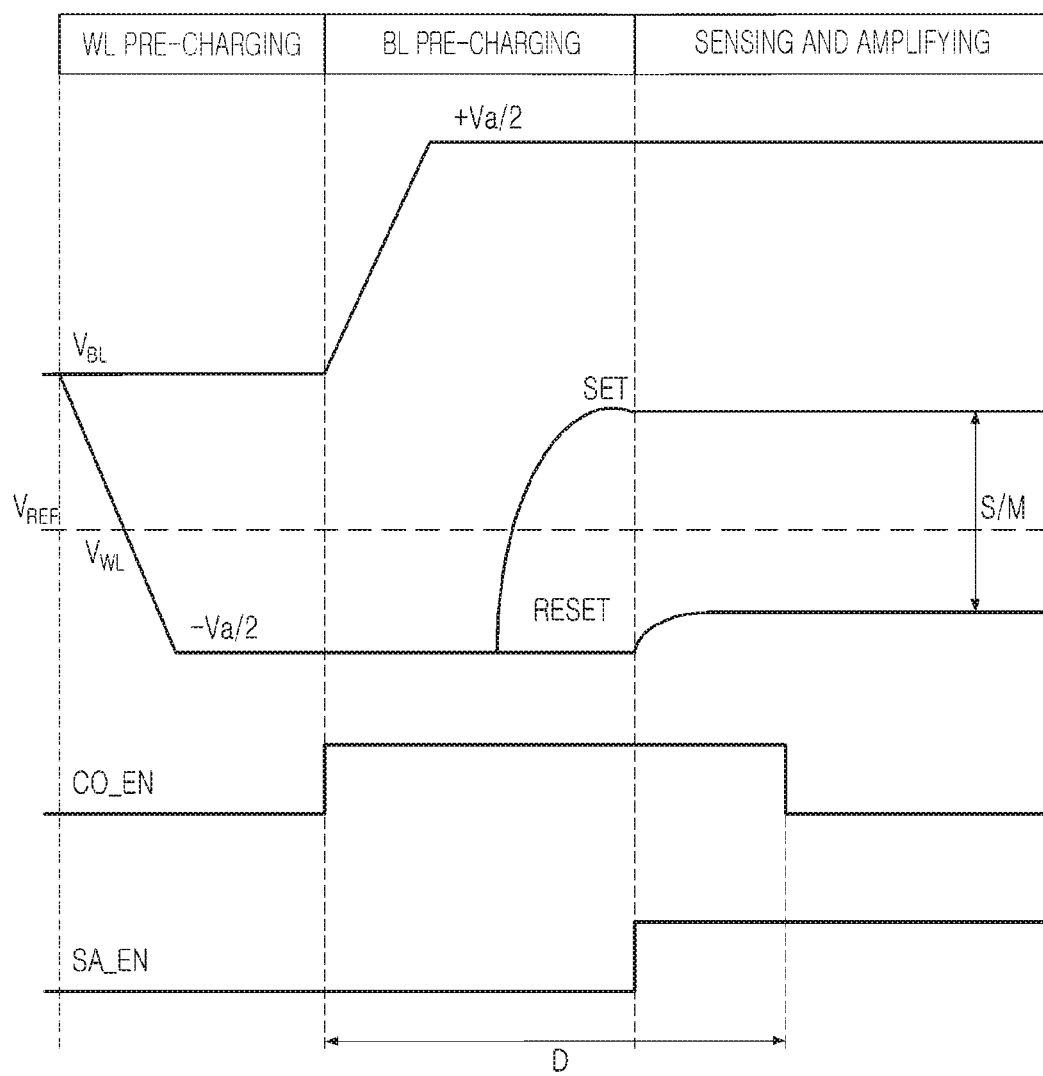

FIGS. 14A and 14B are graphs illustrating a memory device according to exemplary embodiments of the present inventive concept. Referring to FIG. 14 along with FIG. 12, the first sense amplifier 631 may be enabled in response to an enable signal CO_EN. The first sense amplifier 631 may be enabled for a predetermined period of time D.

Distributions of a threshold voltage of a memory cell may be varied depending on processes. In other words, the threshold voltage of the memory cell may be varied depending on properties of the memory cell. The memory cell having properties as in the graph illustrated in FIG. 14A may have a threshold voltage relatively smaller than a threshold voltage of the memory cell having properties as in the graph illustrated in FIG. 14B. Thus, the memory cell having properties as in the graph illustrated in FIG. 14A may be turned on before the memory cell having properties as in the graph illustrated in FIG. 14B. The first sense amplifier 631 may be enabled during the predetermined period of time D, and may monitor the voltage $V_{SDL}$ of a selected data line path and the reference voltage $V_{REF}$ during the predetermined period of time D.

The first sense amplifier 631 may control the second sense amplifier 633 to output a difference between the voltage $V_{SDL}$ of the selected data line path and the reference voltage $V_{REF}$ when the voltage $V_{SDL}$ of the selected data line path is greater than the reference voltage $V_{REF}$. Accordingly, a sensing margin of a readout voltage of the selected memory cell in the set state may increase.

The memory cell having properties as in the graph illustrated in FIG. 14B may have the threshold voltage relatively greater than the threshold voltage of the memory cell having properties as in the graph illustrated in FIG. 14A. Accordingly, the memory cell having properties as in the graph illustrated in FIG. 14B may be turned on later than the memory cell having properties as in the graph illustrated in FIG. 14A.

The first sense amplifier 631 may control the second sense amplifier 633 to output a difference between the voltage $V_{SDL}$ of the selected data line path and the reference voltage $V_{REF}$ when the voltage $V_{SDL}$ of the selected data line path is greater than the reference voltage $V_{REF}$.

However, when the memory cell having properties as in the graph illustrated in FIG. 14B compensates for the leakage current flowing through non-selected memory cells using a compensation current, the memory cell may sufficiently secure a sensing margin of the readout voltage of the selected memory cell in the set state, even when the first sense amplifier 631 does not move up an enable time point of the second sense amplifier 633.

Figure 15A:
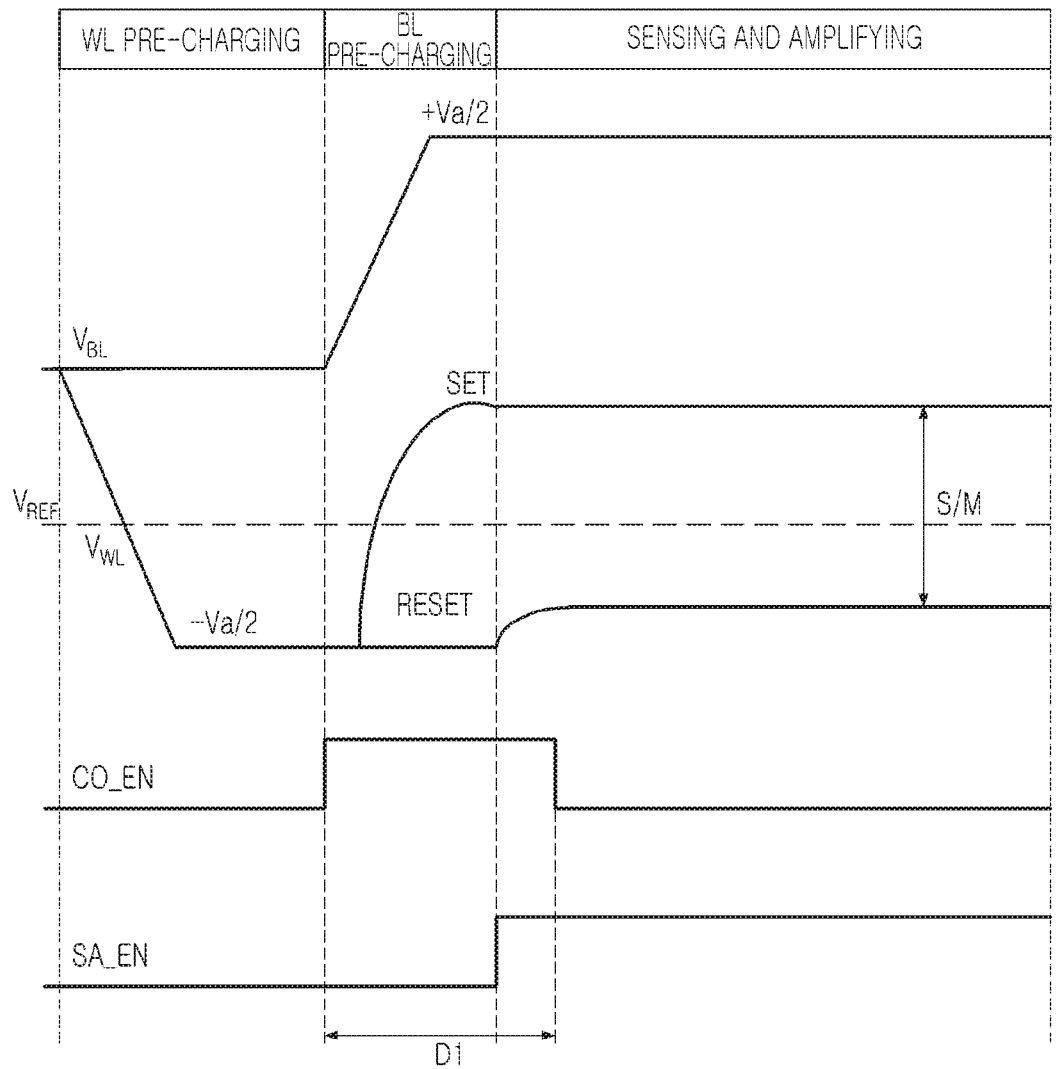
FIGS. 15A and 15B are graphs illustrating a memory device according to exemplary embodiments of the present inventive concept.
Figure 15B:
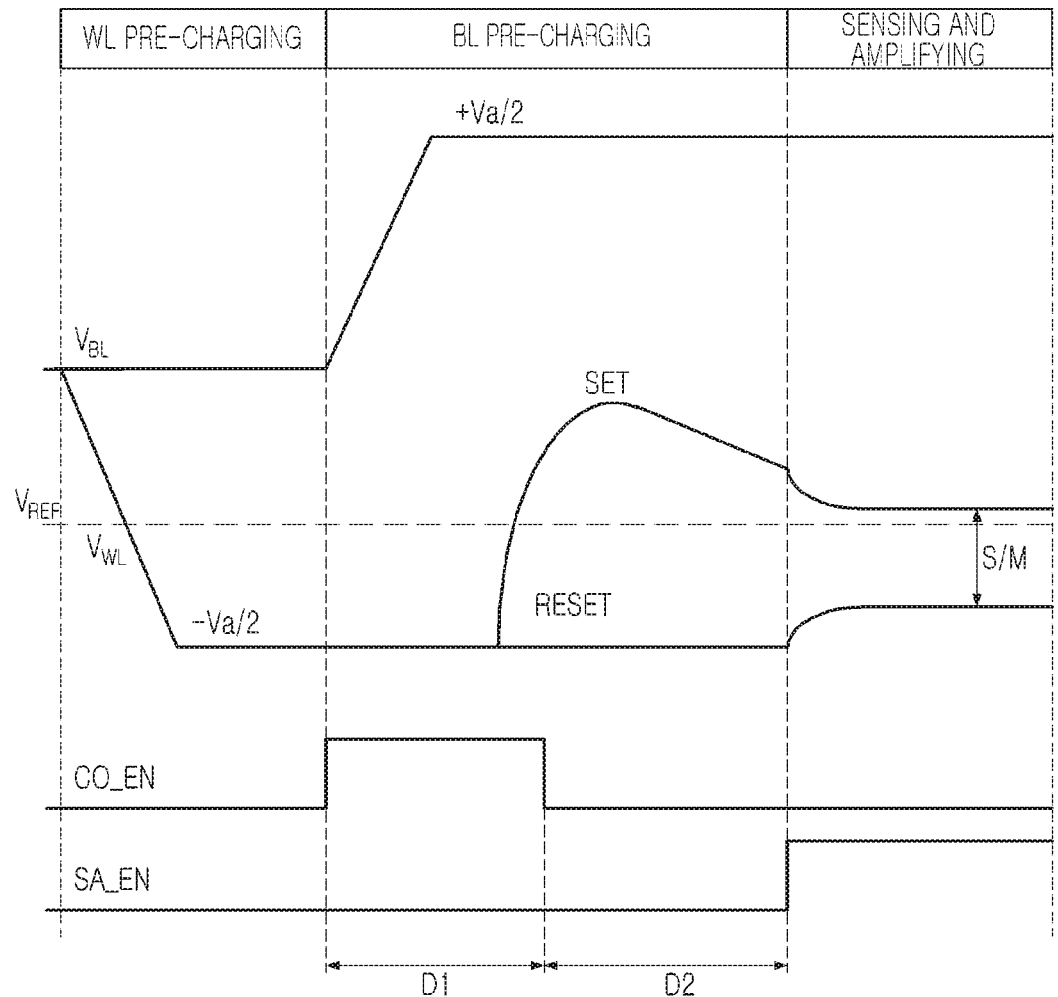

FIGS. 15A and 15B are graphs illustrating a memory device according to exemplary embodiments of the present inventive concept. Referring to FIGS. 15A and 15B along with FIG. 12, a readout operation may include the word line pre-charging section, the bit line pre-charging section, and the sensing amplifying section. The first sense amplifier 631 may be enabled in response to the enable signal CO_EN. For example, the first sense amplifier 631 may be enabled during a first pre-charging time D1 in which a selected bit line is pre-charged, and may be disabled during a second pre-charging time D2 in which the selected bit line is pre-charged. The second pre-charging time D2 may be subsequent to the first pre-charging time D1.

Referring to FIG. 15A, the first sense amplifier 631 may be enabled in response to the enable signal CO_EN during the first pre-charging time D1. Memory cells having a relatively small threshold voltage may be turned on during the first pre-charging time D1. The first sense amplifier 631 may monitor the voltage $V_{SDL}$ of the selected data line path and the reference voltage $V_{REF}$ during the first pre-charging time D1. The first sense amplifier 631 may move up an enable time point of the second sense amplifier 633 to a time point at which the voltage $V_{SDL}$ of the selected data line path is greater than the reference voltage $V_{REF}$. Accordingly, a sensing margin of a readout voltage of a selected memory cell in a set state may be sufficiently secured.

When the second sense amplifier 633 amplifies a voltage difference between the voltage $V_{SDL}$ of the selected data line path and the reference voltage $V_{REF}$ while the first sense amplifier 631 maintains an enable state, a readout operation may be terminated.

Referring to FIG. 15B, the first sense amplifier 631 may be disabled during the second pre-charging time D2 subsequent to the first pre-charging time D1. Memory cells having a relatively great threshold voltage may be turned on during the second pre-charging time D2.

Different from the exemplary embodiment illustrated in FIG. 15A, when the second sense amplifier 633 does not amplify a voltage difference between the voltage $V_{SDL}$ of the selected data line path and the reference voltage $V_{REF}$ while the first sense amplifier 631 maintains the enable state, the second sense amplifier 633 may be enabled at a predetermined time point after the second pre-charging time D2.

As an example, the second sense amplifier 633 may be enabled in response to the enable signal SA_EN at a time point at which the sensing amplifying section starts, and the second sense amplifier 633 may output a difference between the voltage $V_{SDL}$ of the selected data line path and the reference voltage $V_{REF}$.

Even when the first sense amplifier 631 does not move up an enable time point of the second sense amplifier 633, and the second sense amplifier 633 is enabled at a time point at which the sensing amplifying section starts, a sensing margin of a readout voltage of the selected memory cell in a set state may be sufficiently secured.

In the exemplary embodiment illustrated in FIG. 14, the first sense amplifier 631 may be enabled for a time period D, a sum of the first pre-charging time D1 and the second pre-charging time D2, regardless of a threshold voltage of the memory cells. In the exemplary embodiment illustrated in FIGS. 15A and 15B, different from FIG. 14, the first sense amplifier 631 may only be enabled during the first pre-charging time D1 in which the memory cells having a relatively small threshold voltage are turned on, and the first sense amplifier 631 may be disabled during the second pre-charging time D2 in which the memory cells having a relatively great threshold voltage are turned on, thus reducing power consumption of the memory device 600.

Figure 16:
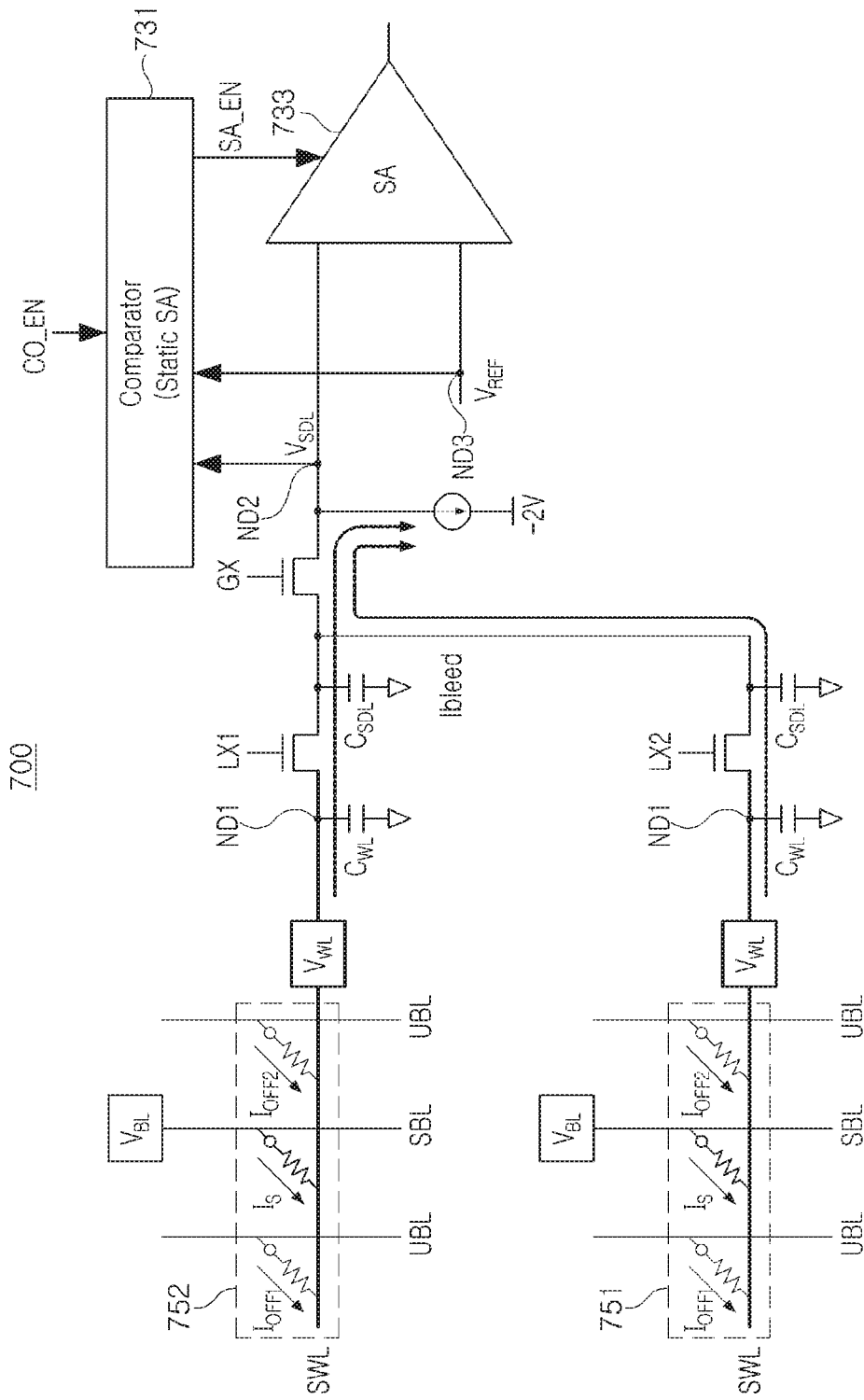
FIG. 16 is a circuit diagram illustrating a memory device according to an exemplary embodiment of the present inventive concept.

FIG. 16 is a circuit diagram illustrating a memory device according to an exemplary embodiment of the present inventive concept. Referring to FIG. 16, a memory cell array of a memory device 700 may include first memory cells 751 connected to a first word line formed on a first layer, and second memory cells 752 connected to a second word line formed on a second layer on an upper portion of the first layer.

A data selection line connected to a second sense amplifier 733 may be connected to a global word line. The global word line may be connected to the data selection line through a global word line switch GX. The global word line may be connected to a first local word line and a second local word line. The first local word line may be connected to the global word line through a first local word line switch LX1, and the second local word line may be connected to the global word line through a second local word line switch LX2.

Distribution of a threshold voltage of a memory cell may be varied depending on a process. For example, distributions of a threshold voltage of memory cells disposed on different layers may be different from one another. Accordingly, an operating time of a first sense amplifier 731 may be varied depending on whether the memory cell is included in the first layer or in the second layer.

For example, when a threshold voltage of the first memory cells 751 connected to the first word line formed on the first layer is smaller than a threshold voltage of the second memory cells 752 connected to the second word line formed on the second layer, a time point at which the first sense amplifier 731 is enabled in a readout operation related to the first memory cells 751 may be earlier than a time point at which the first sense amplifier 731 is enabled in a readout operation related to the second memory cells 752.

Figure 17A:
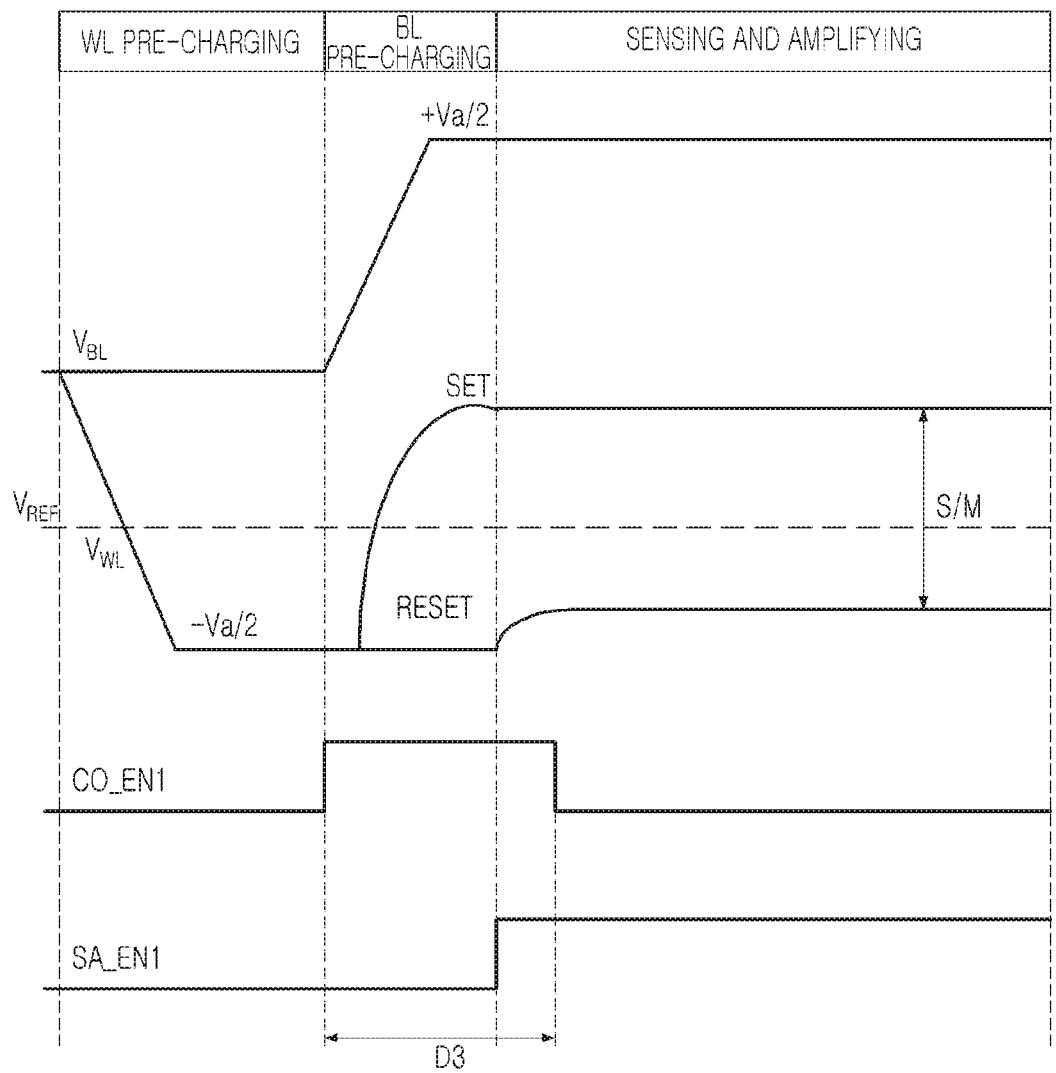
FIGS. 17A and 17B are graphs illustrating a memory device according to exemplary embodiments of the present inventive concept.
Figure 17B:
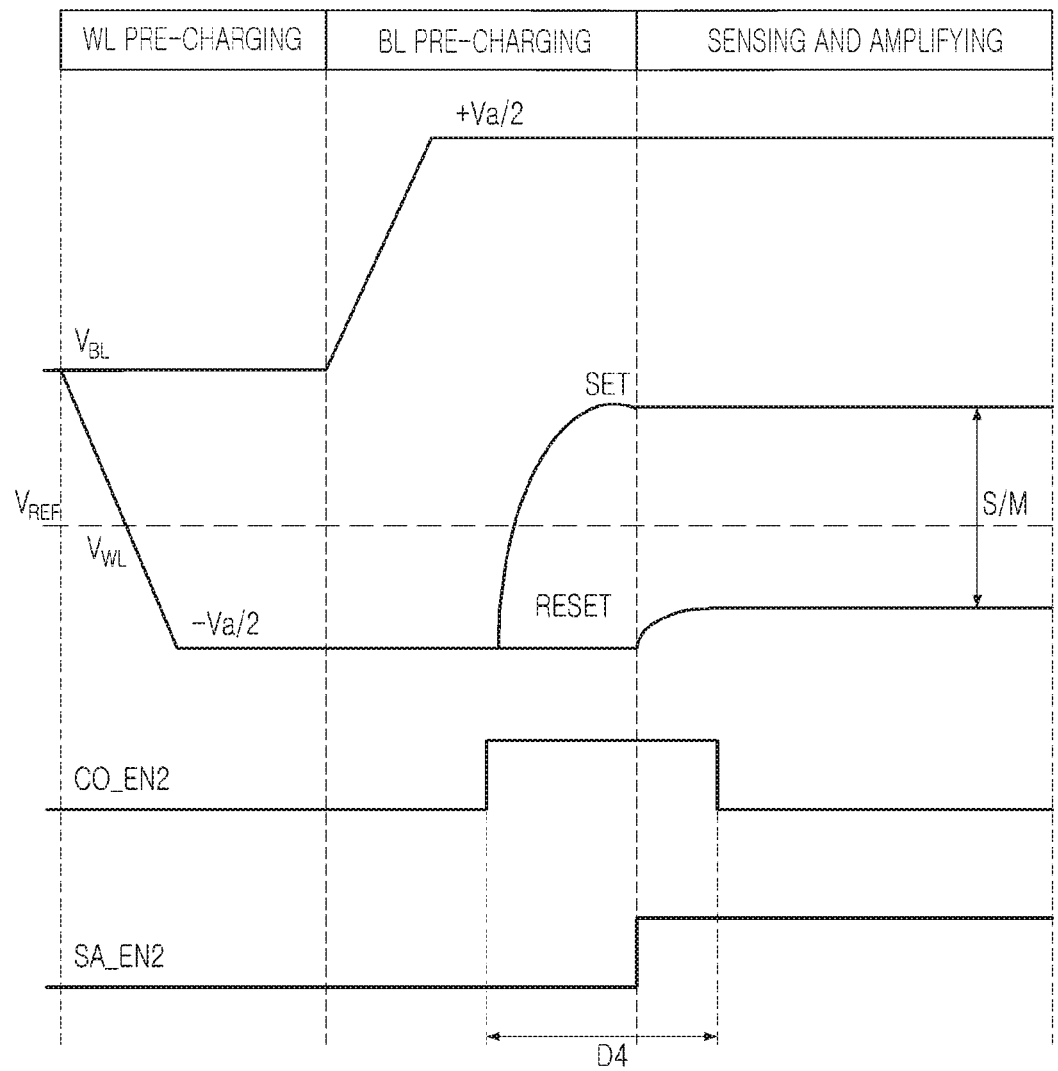

FIGS. 17A and 17B are graphs illustrating a memory device according to exemplary embodiments of the present inventive concept. In FIGS. 17A and 17B, enable signals SA_EN1 and SA_EN2 may be configured similar to the enable signal SA_EN of FIGS. 14A and 14B. Referring to FIG. 17A along with FIG. 16, the first sense amplifier 731 may operate during a first operating time D3 of the bit line pre-charging time in a readout operation related to the first memory cells 751 having a relatively small threshold voltage. The first sense amplifier 731 may be enabled in response to a first enable signal CO_EN1.

The first sense amplifier 731 may monitor the voltage $V_{SDL}$ of the selected data line path and the reference voltage $V_{REF}$ during the first operating time D3. The first sense amplifier 731 may move up an enable time point of the second sense amplifier 733 to a time point at which the voltage $V_{SDL}$ of the selected data line path is greater than the reference voltage $V_{REF}$.

Referring to FIG. 17B along with FIG. 16, the first sense amplifier 731 may operate during a second operating time D4 of the bit line pre-charging time in a readout operation related to the second memory cells 752 having a relatively great threshold voltage. The second operating time D4 may be different from the first operating time D3, and start later than the first operating time D3. The first sense amplifier 731 may be enabled in response to a second enable signal CO_EN2 different from the first enable signal CO_EN1.

The first sense amplifier 731 may monitor the voltage $V_{SDL}$ of the selected data line path and the reference voltage $V_{REF}$ during the second operating time D4. The first sense amplifier 731 may move up an enable time point of the second sense amplifier 733 to a time point at which the voltage $V_{SDL}$ of the selected data line path is greater than the reference voltage $V_{REF}$.

Accordingly, operating times of the first sense amplifier 731 for the first memory cells 751 connected to the first word line formed on the first layer and for the second memory cells 752 connected to the second word line formed on the second layer may be different from each other. In other words, the operating time of the first sense amplifier 731 may be adjusted in accordance with threshold voltages of memory cells, thus reducing power consumption of the memory device 700.

Figure 18:
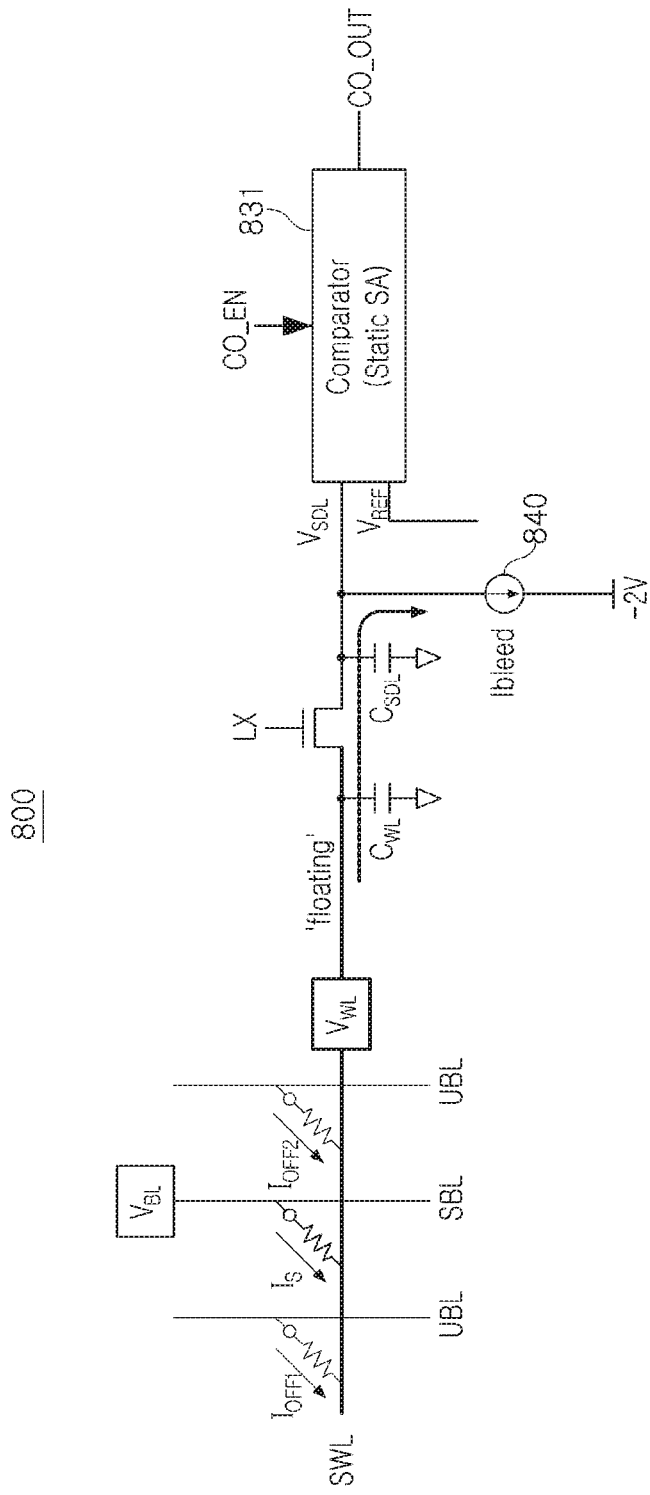
FIG. 18 is a circuit diagram illustrating a memory device according to an exemplary embodiment of the present inventive concept.
Figure 19A:
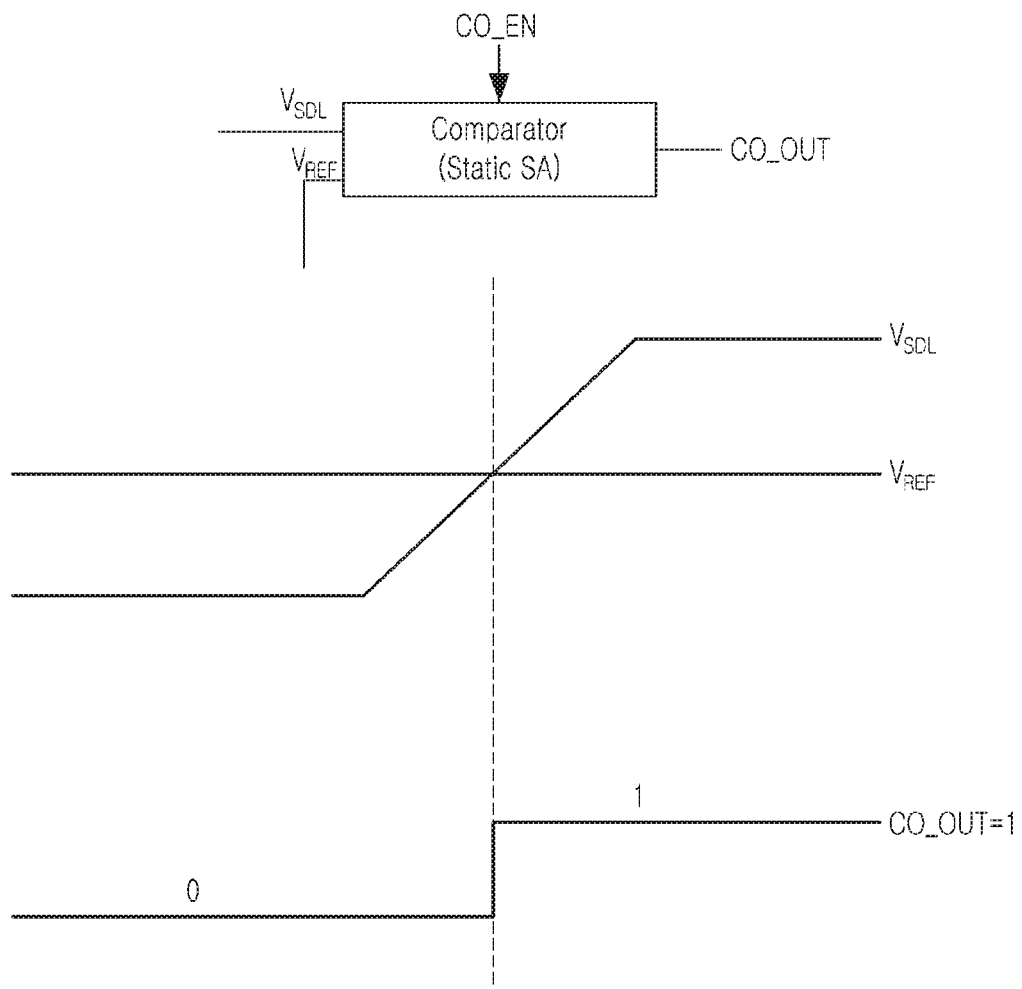
FIGS. 19A and 19B are graphs illustrating the memory device according to exemplary embodiments of the present inventive concept.
Figure 19B:
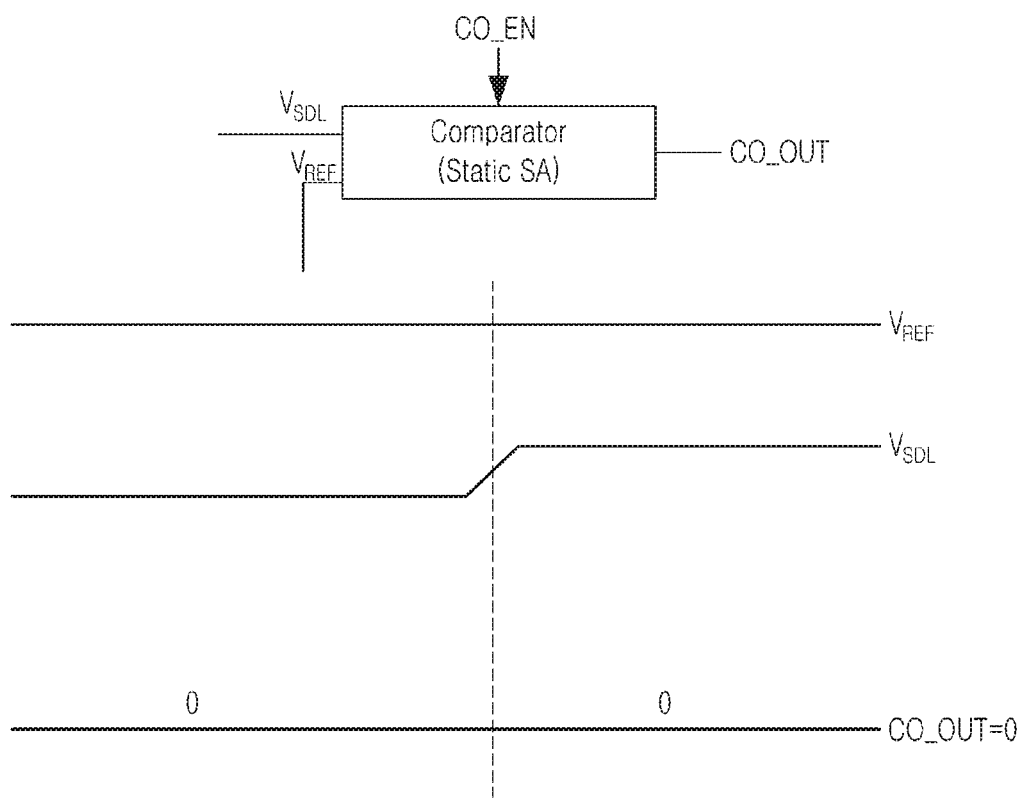

FIG. 18 is a circuit diagram illustrating a memory device according to an exemplary embodiment of the present inventive concept. FIGS. 19A and 19B are graphs illustrating the memory device of FIG. 18 according to exemplary embodiments of the present inventive concept. In the description below, a difference between a memory device of FIG. 18 and the memory device 600 of FIG. 12 will be described. In the present exemplary embodiment illustrated in FIG. 18, the voltage $V_{SDL}$ of a selected data line path and the reference voltage $V_{REF}$ may be monitored using a first sense amplifier 831 instead of the second sense amplifier 633 illustrated in FIG. 12, and data "0" or data "1" may be output as an output CO_OUT in accordance with a result of the monitoring.

FIG. 19A is a graph illustrating an operation of the first sense amplifier 831 when a state of a selected memory cell is a set state. Referring to FIG. 19A along with FIG. 18, the first sense amplifier 831 may receive the voltage $V_{SDL}$ of the selected data line path through a first input terminal and may receive the reference voltage $V_{REF}$ through a second input terminal in a sensing section of a readout operation. The first sense amplifier 831 may monitor the voltage $V_{SDL}$ of the selected data line path and the reference voltage $V_{REF}$. When the readout voltage Va is applied to both ends of the selected memory cell and the selected memory cell is turned on, the voltage $V_{SDL}$ of the selected data line path may increase by a sensing current and a leakage current. The first sense amplifier 831 may output data "1" when the voltage $V_{SDL}$ of the selected data line path is greater than the reference voltage $V_{REF}$.

FIG. 19B is a graph illustrating an operation of the first sense amplifier 831 when the state of the selected memory cell is a reset state. Referring to FIG. 19B along with FIG. 18, the first sense amplifier 831 may monitor the voltage $V_{SDL}$ of the selected data line path and the reference voltage $V_{REF}$ in the sensing section. Even when the readout voltage Va is applied to both ends of the selected memory cell, the selected memory cell is not turned on, and the leakage current flowing through non-selected memory cells may be compensated by a current compensation circuit 840, and accordingly, the voltage $V_{SDL}$ of the selected data line path may not change. The first sense amplifier 831 may output data "0" at a predetermined time point.

In exemplary embodiments of the present inventive concept, the first sense amplifier 831 may have an initial state. For example, the first sense amplifier 831 may output a value indicating that a voltage input to the first input terminal is smaller than a voltage input to the second input terminal in the initial state of the first sense amplifier 831. The first sense amplifier 831 may monitor the voltage $V_{SDL}$ of the selected data line path and the reference voltage $V_{REF}$ in the sensing section.

When the voltage $V_{SDL}$ of the selected data line path is greater than the reference voltage $V_{REF}$, an output of the first sense amplifier 831 may be reversed, and accordingly, the first sense amplifier 831 may output data "1". However, when the voltage $V_{SDL}$ of the selected data line path is smaller than the reference voltage $V_{REF}$, the output of the first sense amplifier 831 may not be reversed, and accordingly, the first sense amplifier 831 may output data "0".

When the first sense amplifier 831 outputs data "1", a readout operation may be terminated. For example, when the first sense amplifier 831 outputs data "1", the memory device may disable the first sense amplifier 831, and may control a voltage of a selected word line and a voltage of a selected bit line to return to the initial state.

Figure 20:
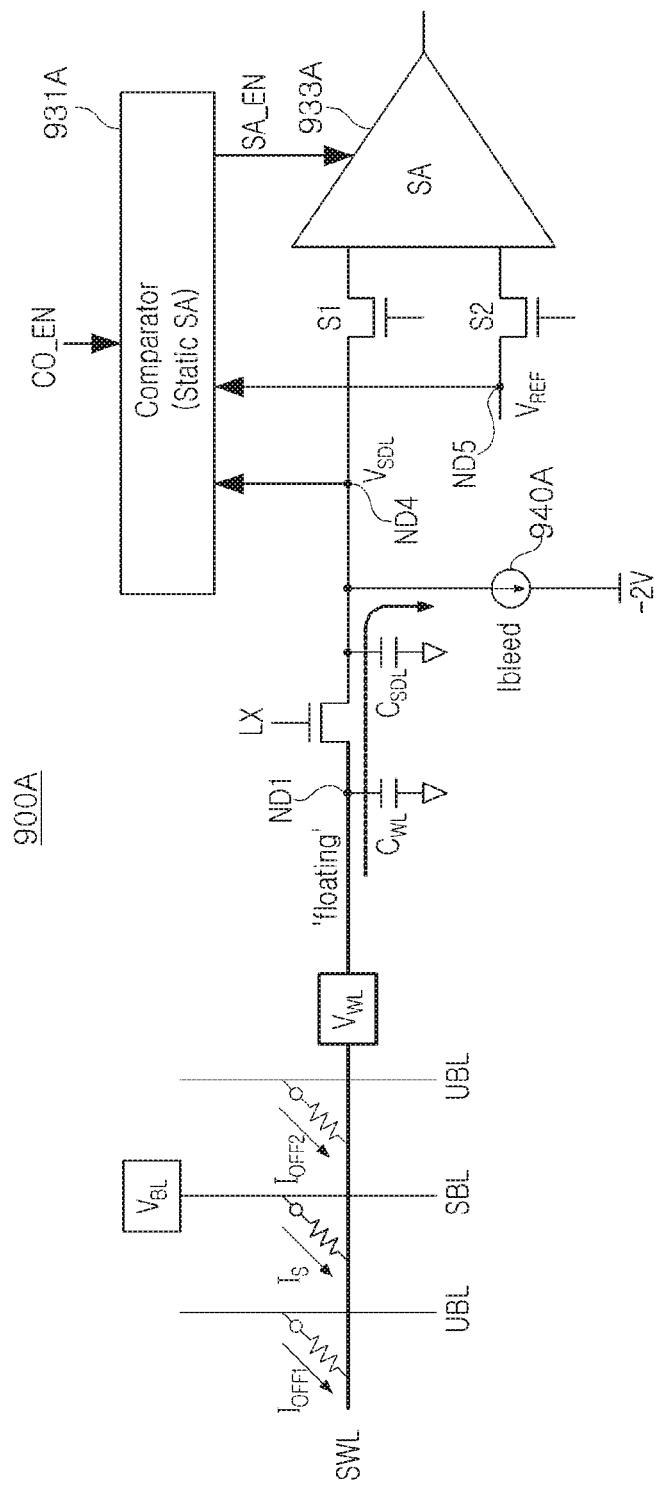
FIGS. 20 and 21 are circuit diagrams illustrating a memory device according to exemplary embodiments of the present inventive concept.
Figure 21:
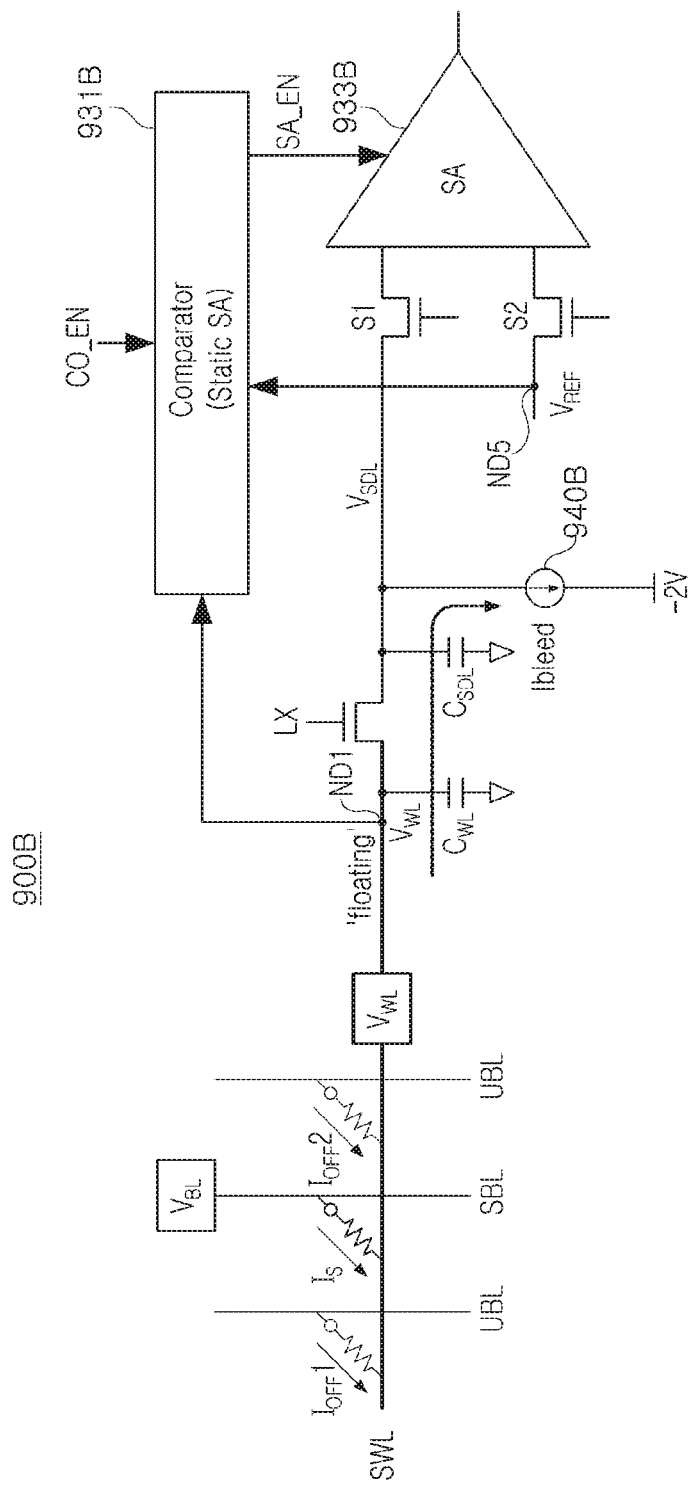

FIGS. 20 and 21 are circuit diagrams illustrating a memory device according to exemplary embodiments of the present inventive concept. As compared to the exemplary embodiment of FIG. 12, a memory device 900A in FIG. 20 may further include a first switch S1 connecting the voltage $V_{SDL}$ of the selected data line path to a first terminal of a second sense amplifier 933A, and a second switch S2 connecting the reference voltage $V_{REF}$ to a second terminal of the second sense amplifier 933A.

The memory device 900A may further include a fourth node ND4 disposed between the local word line switch LX, disposed in a local word line path, and the first switch S1, and a fifth node ND5 disposed between a reference voltage power source supplying the reference voltage $V_{REF}$ and the second switch S2. A first sense amplifier 931A may include a first terminal connected to the fourth node ND4, and a second terminal connected to the fifth node ND5. The first sense amplifier 931A may receive the voltage $V_{SDL}$ of the selected data line path through the fourth node ND4 and may receive the reference voltage $V_{REF}$ through the fifth node ND5.

As compared to the exemplary embodiment in FIG. 20, a first sense amplifier 931B of a memory device 900B in FIG. 21 may include a first terminal connected to the first node ND1, and a second terminal connected to the fifth node ND5. The first sense amplifier 931B may receive the voltage $V_{WL}$ of a selected word line through the first node ND1, and may receive the reference voltage $V_{REF}$ through the fifth node ND5. A second sense amplifier 933B may be similar to the second sense amplifier 933A of FIG. 20.

Figure 22:
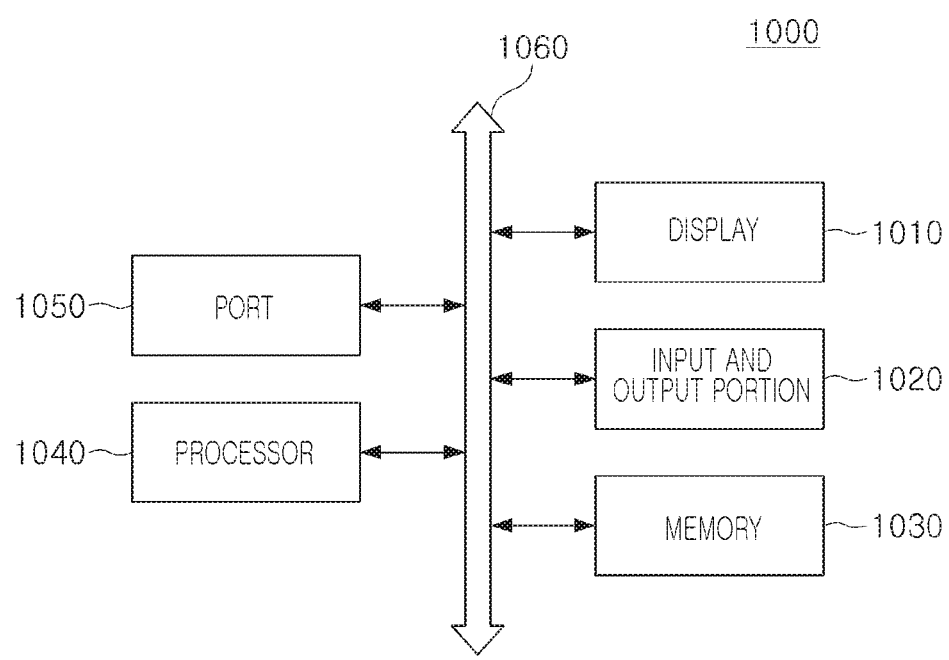
FIG. 22 is a block diagram illustrating an electronic device including a memory device according to an exemplary embodiment of the present inventive concept.

FIG. 22 is a block diagram illustrating an electronic device including a memory device according to an exemplary embodiment of the present inventive concept.

A computing device 1000 in the present exemplary embodiment illustrated in FIG. 22 may include a display 1010, an input and output portion 1020, a memory 1030, a processor 1040, a port 1050, and other elements. For example, the computing device 1000 may further include a wired and wireless communication device, a power device, or the like. Among the elements illustrated in FIG. 22, the port 1050 may be provided for the computing device 1000 to communicate with a video card, a sound card, a memory card, a USB device, or the like. The computing device 1000 may include a general desktop computer or a laptop computer, and may also include a smartphone, a tablet personal computer (PC), a smart wearable device, or the like.

The processor 1040 may perform a certain calculation or a task, or may process a command. The processor 1040 may be implemented as a central processing unit (CPU), a microprocessor unit (MCU), a system on chip (SoC), or the like, and may communicate with the display 1010, the input and output portion 1020, and the memory 1030, and with other devices connected to the port 1050 through a bus 1060.

The memory 1030 may be a storage medium storing data for operation of the computing device 1000, multimedia data, or the like. The memory 1030 may include a volatile memory such as a random access memory (RAM), or a non-volatile memory such as a flash memory or the like. The memory 1030 may include at least one of a solid state drive (SSD), a hard disk drive (HDD), or an optical disc drive (ODD). The input and output portion 1020 may include an input device such as a keyboard, a mouse, a touch screen, or the like, and an output device such as a display, an audio output unit, or the like.

The memory 1030 may include a phase change memory device writing, erasing, and reading out data using changes in resistance of a phase change material thereof. Additionally, in the present exemplary embodiment illustrated in FIG. 22, the memory 1030 may include the memory device described in the aforementioned exemplary embodiments with reference to FIGS. 1 to 21.

According to the aforementioned exemplary embodiments of the present inventive concept, a memory device may sufficiently secure a sensing margin of a readout voltage of a selected memory cell in a reset state by compensating for a leakage current, and may sufficiently secure a sensing margin of the readout voltage of the selected memory cell in a set state by adjusting an operating time of a sense amplifier. Accordingly, accuracy of a readout operation of the memory device may improve.

While the present inventive concept has been shown and described above with reference to exemplary embodiments thereof, it will be apparent to those of ordinary skill in the art that modifications and variations in form and details could be made thereto without departing from the spirit and scope of the present inventive concept as set forth by the appended claims.

What is claimed is:

1. A memory device, comprising:
a memory cell array including a plurality of memory cells disposed at points at which a plurality of word lines and a plurality of bit lines intersect one another, respectively;
a first decoder circuit configured to determine a selected bit line and non-selected bit lines among the plurality of bit lines;
a second decoder circuit configured to determine a selected word line and non-selected word lines among the plurality of word lines;
a current compensation circuit configured to provide a current path drawing a compensation current from the selected word line to compensate for off currents flowing in the non-selected bit lines;
a first sense amplifier configured to compare a voltage of the selected word line with a reference voltage and to output an enable signal; and
a second sense amplifier configured to output a voltage difference between the voltage of the selected word line and the reference voltage during an operating time determined by the enable signal in a readout operation mode of the memory device.

2. The memory device of claim 1, wherein the compensation current is greater than 0 and less than 10 µA.

3. The memory device of claim 2, wherein the compensation current is 1 µA to 3 µA.

4. The memory device of claim 1,
wherein the selected word line includes a selected local word line and a selected global word line, and
wherein the first sense amplifier includes a first terminal connected to a global word line path indicating an electrical path on the selected global word line, and a second terminal configured to receive the reference voltage.

5. The memory device of claim 4, further comprising:
a first switch disposed between the first terminal of the first sense amplifier and the second sense amplifier; and
a second switch disposed between the second terminal of the first sense amplifier and the second sense amplifier.

6. The memory device of claim 1,
wherein the selected word line includes a selected local word line and a selected global word line, and
wherein the first sense amplifier includes a first terminal connected to a local word line path indicating an electrical path on the selected local word line, and a second terminal configured to receive the reference voltage.

7. The memory device of claim 1, wherein, in the readout operation mode, when the voltage of the selected word line is greater than the reference voltage, the first sense amplifier enables the second sense amplifier, and the second sense amplifier amplifies the voltage difference between the voltage of the selected word line and the reference voltage.

8. The memory device of claim 7,
wherein the first sense amplifier is enabled during a first pre-charging time in which the selected bit line is pre-charged, and the first sense amplifier is disabled during a second pre-charging time in which the selected bit line is pre-charged, and
wherein the second pre-charging time is subsequent to the first pre-charging time.

9. The memory device of claim 8, wherein, when the second sense amplifier amplifies the voltage difference between the voltage of the selected word line and the reference voltage while the first sense amplifier maintains an enable state, the readout operation mode is terminated.

10. The memory device of claim 9, wherein, when the second sense amplifier does not amplify the voltage difference between the voltage of the selected word line and the reference voltage while the first sense amplifier maintains an enable state, the second sense amplifier is enabled at a predetermined time point after the second pre-charging time, and the second sense amplifier outputs the voltage difference between the voltage of the selected word line and the reference voltage.

11. The memory device of claim 1,
wherein the memory cell array includes first memory cells connected to a first word line formed on a first layer, and second memory cells connected to a second word line formed on a second layer on an upper portion of the first layer, and
wherein an operating time of the first sense amplifier for the first memory cells included in the first layer is different from an operating time of the first sense amplifier for the second memory cells included in the second layer.

12. The memory device of claim 1,
wherein the selected word line includes a selected local word line and a selected global word line,
wherein the second decoder circuit includes a local word line switch included in a local word line path indicating an electrical path on the selected local word line, and
wherein the local word line switch is turned on during a time in which the selected bit line is pre-charged.

13. The memory device of claim 1,
wherein the selected word line includes a selected local word line and a selected global word line,
wherein the second decoder circuit includes a local word line switch included in a local word line path indicating an electrical path on the selected local word line, and
wherein the local word line switch receives a gate voltage smaller than a threshold voltage of the local word line switch and greater than a ground voltage during a time in which the selected bit line is pre-charged.

14. A memory device, comprising:
a plurality of memory cells connected to a plurality of bit lines and a plurality of word lines;
a decoder circuit configured to pre-charge a selected word line of the plurality of word lines, and connect the selected word line to a current path in a sensing section;
a current compensation circuit configured to provide a current path drawing a compensation current from the selected word line to compensate for off-currents flowing in non-selected bit lines other than a selected bit line among the plurality of bit lines in the sensing section;
a first sense amplifier configured to compare a voltage of the selected word line and a reference voltage and output an enable signal in the sensing section; and
a second sense amplifier configured to output a voltage difference between the voltage of the selected word line and the reference voltage in response to the enable signal.

15. The memory device of claim 14, wherein the second sense amplifier includes a first input terminal configured to receive a sensing voltage corresponding to a state of a selected memory cell, and a second input terminal configured to receive the reference voltage.

16. The memory device of claim 15, further comprising:
a first switch configured to selectively connect the first input terminal of the second sense amplifier to the selected word line, and a second switch configured to selectively connect the second input terminal of the second sense amplifier to a reference voltage source supplying the reference voltage.

17. The memory device of claim 16, further comprising:
a local word line switch included in a selected word line path connected between the selected memory cell and the first switch,
wherein the first sense amplifier includes a first terminal connected to a path connected between the local word line switch and the first switch, and a second terminal connected to a path connected between the reference voltage source and the second switch.

* * * * *